United States Patent
Kang et al.

(10) Patent No.: US 9,558,805 B2
(45) Date of Patent: Jan. 31, 2017

(54) MEMORY MODULES AND MEMORY SYSTEMS

(71) Applicant: SAMSUNG ELECTRONICS CO., LTD., Suwon-si, Gyeonggi-do (KR)

(72) Inventors: Uk-Song Kang, Seongnam-si (KR); Chul-Woo Park, Yongin-si (KR); Hak-Soo Yu, Seongnam-si (KR); Jong-Pil Son, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 513 days.

(21) Appl. No.: 14/083,033

(22) Filed: Nov. 18, 2013

(65) Prior Publication Data

US 2014/0189215 A1   Jul. 3, 2014

(30) Foreign Application Priority Data

Dec. 28, 2012  (KR) .......................... 10-2012-0155872

(51) Int. Cl.
  *G06F 13/00*  (2006.01)
  *G11C 11/406*  (2006.01)
  *G11C 11/408*  (2006.01)

(52) U.S. Cl.
  CPC .... *G11C 11/40607* (2013.01); *G11C 11/40603* (2013.01); *G11C 11/40622* (2013.01); *G11C 11/4087* (2013.01)

(58) Field of Classification Search
  CPC ............ G06F 12/02; G06F 12/06; G11C 7/04; G11C 7/00
  See application file for complete search history.

(56) References Cited

U.S. PATENT DOCUMENTS

| | | | | |
|---|---|---|---|---|
| 5,596,545 A | * | 1/1997 | Lin | G11C 11/406 365/194 |
| 5,629,898 A | | 5/1997 | Idei et al. | |
| 6,167,484 A | * | 12/2000 | Boyer | G11C 11/406 365/222 |
| 6,898,138 B2 | | 5/2005 | Meyer et al. | |
| 7,345,941 B2 | | 3/2008 | Matsui | |

(Continued)

FOREIGN PATENT DOCUMENTS

| | | |
|---|---|---|
| JP | 2005-222593 | 8/2005 |
| KR | 10-0407024 | 11/2013 |

OTHER PUBLICATIONS

Dongchul Park, et al., "Hot and Cold Data Identification for Flash Memory Using Multiple Bloom Filters," pp. 1-2.

(Continued)

*Primary Examiner* — Charles Rones
*Assistant Examiner* — Han Doan
(74) *Attorney, Agent, or Firm* — F. Chau & Associates, LLC

(57) ABSTRACT

A memory module includes a plurality of memory devices and a buffer chip. The buffer chip manages the memory devices. The buffer chip includes a refresh control circuit that groups a plurality of memory cell rows of the memory devices into a plurality of groups according to a data retention time of tire memory cell rows. The buffer chip selectively refreshes each of the plurality of groups in each of a plurality of refresh time regions that are periodically repeated and applies respective refresh periods to the plurality of groups, respectively.

18 Claims, 21 Drawing Sheets

(56) References Cited

U.S. PATENT DOCUMENTS

| | | | |
|---|---|---|---|
| 7,836,374 B2 | 11/2010 | Klein | |
| 2004/0128433 A1* | 7/2004 | Bains | G11C 11/406 |
| | | | 711/106 |
| 2005/0099868 A1* | 5/2005 | Oh | G11C 11/406 |
| | | | 365/222 |
| 2005/0169083 A1 | 8/2005 | Riho et al. | |
| 2006/0013052 A1* | 1/2006 | Klein | G11C 7/1006 |
| | | | 365/222 |
| 2008/0313494 A1 | 12/2008 | Hummler et al. | |
| 2009/0046531 A1 | 2/2009 | Noh et al. | |
| 2011/0131371 A1 | 6/2011 | Sun et al. | |
| 2012/0075947 A1* | 3/2012 | Kang | G11C 11/40618 |
| | | | 365/222 |
| 2013/0080385 A1* | 3/2013 | Ho | G06F 17/30578 |
| | | | 707/613 |

OTHER PUBLICATIONS

Jen-Wei Hsieh, et al., "Efficient Identification of Hot Data for Flash-Memory Storage Systems," pp. 1-19, ACM Transaction on Storage, vol. 2, No. 1, 2006.

Adam Kirsch, et al., "Hash-Based Techniques for High-Speed Packet Processing," pp. 1-40.

Mrinmoy Ghosh, et al., "Smart Refresh: An Enhanced Memory Controller Designed for Reduging Energy in Conventional and 3D Die-Stacked Drams," pp. 1-12.

* cited by examiner

FIG. 4B

|  | X7 | X6 | X5 | X4 | X3 | X2 | X1 | X0 |
|---|---|---|---|---|---|---|---|---|
| WEAK_ADDR1 | 1 | 1 | 1 | 1 | 0 | 0 | 1 | 0 |
| WEAK_ADDR2 | 0 | 1 | 1 | 0 | 0 | 0 | 1 | 1 |
| WEAK_ADDR3 | 1 | 0 | 0 | 0 | 0 | 1 | 1 | 1 |
| WEAK_ADDR4 | 0 | 1 | 0 | 1 | 0 | 0 | 0 | 0 |
| WEAK_ADDR5 | 0 | 1 | 1 | 0 | 0 | 0 | 1 | 0 |

H3 →

| X3 | X2 | X1 | X0 |  |
|---|---|---|---|---|
| 0 | 0 | 1 | 0 | :2 |
| 0 | 0 | 1 | 1 | :3 |
| 0 | 1 | 0 | 1 | :5 |
| 0 | 1 | 1 | 0 | :6 |
| 1 | 0 | 0 | 1 | :9 |

FIG. 4C

| INDEX | MV |
|---|---|
| 0 | 0 |
| 1 | 0 |
| 2 | 1 |
| 3 | 1 |
| 4 | 0 |
| 5 | 1 |
| 6 | 1 |
| 7 | 0 |
| 8 | 0 |
| 9 | 1 |
| 10 | 0 |
| 11 | 0 |
| 12 | 0 |
| 13 | 0 |
| 14 | 0 |
| 15 | 0 | ically to a memory device, and more particularly, to a
MEMORY MODULES AND MEMORY SYSTEMS

CROSS-REFERENCE TO RELATED APPLICATION

This U.S. non-provisional application claims priority under 33 USC §119 to Korean Patent Application No. 10-2012-0155872, filed on Dec. 28, 2012, the disclosure of which is incorporated by reference herein in its entirety.

TECHNICAL FIELD

Exemplary embodiments of the present inventive concept relate to a memory device, and more particularly, to a memory module and a memory system.

DISCUSSION OF THE RELATED ART

A volatile memory device, such as a dynamic random access memory (DRAM), performs a refresh operation to retain data stored in its memory cells. Most memory cells in the volatile memory device have a data retention time longer than a refresh period (tREF). When the memory cells of the volatile memory device are refreshed within the refresh period, a refresh current may be increased. Further, the performance of the volatile memory device may be degraded because certain operations cannot be performed during the refresh operation.

SUMMARY

In an exemplary embodiment of the inventive concept, a memory module includes a plurality of memory devices and a buffer chip. The buffer chip manages the memory devices. The buffer chip includes a refresh control circuit that groups a plurality of memory cell rows of the memory devices into a plurality of groups according to data retention time of the memory cell rows. The refresh control circuit selectively and periodically refreshes each of the groups in each of a plurality of refresh time regions. The refresh control circuit applies respective refresh periods to the plurality of groups, respectively.

In an exemplary embodiment of the inventive concept, the refresh control circuit may include a refresh command decoder. The refresh command decoder is configured to provide an internal refresh command by decoding a command from an external device. A refresh counter is configured to generate a refresh row address by performing a counting operation in response to the internal refresh command. The refresh counter is configured to increase a carry bit when the refresh counter generates a maximum address of the refresh row address. A time region counter is configured to output a refresh time region signal that indicates one of the refresh time regions in response to the carry bit. A hashing logic is configured to generate a hashing index by hashing the refresh row address. A bloom filter unit includes a plurality of bloom filter tables in which row addresses of the memory cell rows of each group are hashed and written in some of the refresh time regions. The bloom filters are configured to generate a match signal indicating whether the refresh row address matches the bloom filter tables in response to the hashing index. A refresh command generator is configured to generate a refresh command that determines whether a memory cell row corresponding to the refresh row address is refreshed in response to the refresh time region signal and the match signal.

The refresh time regions may include first through k-th refresh time regions based on the date retention time. The refresh command generator may generate a refresh enable signal that refreshes all of the memory cell rows in all of the groups when the refresh time region signal indicates the first refresh time region. k is an integer equal to or greater than two.

The refresh command generator may generate the refresh enable signal that refreshes memory cell rows of a group associated with bloom filter tables selected by the refresh time region signal when the refresh time region signal indicates other refresh time regions except the first refresh time region of the first through k-th refresh time regions. The refresh command generator may generate a refresh skip command for memory cell rows of a group that is not associated with the selected bloom filter tables.

Each of the memory devices may include an internal refresh counter that operates in synchronization with the refresh counter. The refresh command generator generates the refresh enable signal that refreshes memory cell rows of a group associated with bloom filter tables selected by the refresh time region signal when the refresh time region signal indicates other refresh time regions except the first refresh time region of the first through k-th refresh time regions. The refresh command generator may generate a refresh counter counting-up command for memory cell rows of a group that is not associated with the selected bloom filter tables, the refresh counter counting-up command directing a counting-up operation of the internal refresh counter.

The internal refresh counter may perform the counting-up operation without outputting addresses for refreshing the memory cell rows in response to the refresh counter counting-up command.

In an exemplary embodiment of the inventive concept, the bloom fitter tables may be selected in response to the refresh time region signal. Each of the selected boom filter tables provides a match signal of its corresponding memory cell row in response to the hashing index.

The row addresses of the memory cell rows may be written in the bloom filter tables before or after the memory module is packaged. The bloom filter tables include non-volatile memory devices.

The row addresses of the memory cell rows may be written in the bloom filter tables during a power-up sequence of the memory module. The bloom filter tables include volatile memory devices.

In an exemplary embodiment of the inventive concept, a memory system includes at least one memory device and a memory controller that controls the at least one memory device. The memory controller includes a refresh control circuit configured to group a plurality of memory cell rows of the at least one memory device into a plurality of groups according to data retention times of the memory cell rows. The refresh control circuit is configured to provide a refresh command for selectively and periodically refreshing each group in each of a plurality of refresh time regions. A scheduler is configured to schedule an operation of the at least one memory device in response to the refresh command.

In an exemplary embodiment of the inventive concept, the refresh control circuit may include a refresh counter configured to generate a refresh row address by performing a counting operation. The refresh counter is configured to increase a carry bit when the refresh counter generates a maximum address of the refresh row address. A time region counter is configured to output a refresh time region signal that indicates one of the refresh time regions in response to the carry bit. A hashing logic is configured to generate a hashing index by hashing the refresh row address. A bloom filter unit includes a plurality of bloom filter tables in which row addresses of the memory cell rows of each group are hashed and are written in some of the refresh time regions. The bloom filters are configured to generate a match signal indicating whether the refresh row address matches the bloom filter tables in response to the hashing index. A refresh command generator is configured to generate the refresh command.

In an exemplary embodiment of the inventive concept, the refresh time regions may include first through k-th refresh time regions based on the data retention times. The refresh command generator may generate a refresh enable signal that refreshes all of the memory cell rows in all of the groups when the refresh time region signal indicates the first refresh time region. k is an integer equal to or greater than two.

The refresh command generator may generate the refresh enable signal that refreshes memory cell rows of a group associated with bloom filter tables selected by the refresh time region signal when the refresh time region signal indicates other refresh time regions except the first refresh time region of the first through k-th refresh time regions. The refresh command generator may generate a refresh skip command for memory cell rows of a group that is not associated with the selected bloom filter tables.

The memory device may include an internal refresh counter that operates in synchronization with the refresh counter. The refresh command generator generates the refresh enable signal that refreshes memory cell rows of a group associated with bloom filter tables selected by the refresh time region signal when the refresh time region signal indicates other refresh time regions except the first refresh time region of the first through k-th refresh time regions. The refresh command generator may generate a refresh counter counting-up command for memory cell rows of a group that is not associated with the selected bloom filter tables. The refresh counter counting-up command directs a counting-up operation of the internal refresh counter.

The memory device may transmit a refresh skip message to the memory controller when the at least one memory device does not perform a refresh operation on its corresponding memory cell row in response to the refresh skip command. The memory controller may reschedule an operation of the memory device in response to the refresh skip message. According to an exemplary embodiment of the inventive concept, a memory module comprises a memory device including a plurality of memory cell rows. A control circuit is configured to group the plurality of memory cell rows into a plurality of groups according to data retention time of each of the plurality of the memory cell rows. The control circuit is configured to set a plurality of refresh time regions according to the number of the groups. The plurality of refresh time regions is periodically repeated. The control circuit is configured to refresh the plurality of groups during each of the plurality of refresh time regions. When a filter table corresponds to a predetermined refresh time region of the plurality of refresh time regions, a first group whose address does not match an address stored in the filter table is not refreshed during the predetermined refresh time region. When the filter table does not correspond to the predetermined refresh time region, all of the groups are refreshed during the predetermined refresh time region. The addresses of the groups correspond to hashing indexes, respectively. The control circuit is configured to output a skip command for the first group to the memory device during the predetermined refresh time region. The control circuit is configured to perform a counting-up operation for the first group without outputting the address of the first group during the predetermined refresh time region.

BRIEF DESCRIPTION OF THE DRAWINGS

The above and other features of the inventive concept will become more apparent by describing in detail exemplary embodiments thereof with reference to the accompanying drawings, in which:

FIG. 4B illustrates hashed outputs using a hash table of FIG. 4A, according to an exemplary embodiment of the inventive concept;

FIG. 4C illustrates a bloom filter table in which the hashed outputs in FIG. 4B are written, according to an exemplary embodiment of the inventive concept;

DETAILED DESCRIPTION OF THE EMBODIMENTS

Various exemplary embodiments of the inventive concept will be described in detail hereinafter with reference to the accompanying drawings. The inventive concept may, however, be embodied in many different forms and should not be construed as limited to the exemplary embodiments set forth herein. Like numerals may refer to like or similar elements throughout the specification and the drawings.

It will be understood that when an element is referred to as being "connected to," "coupled to," or "on" another element, it can be directly connected to, coupled to, or on the other element or intervening elements may be present. As used herein, the singular forms "a," "an" and "the" are intended to include the plural forms as well, unless the context clearly indicates otherwise.

Figure 1:
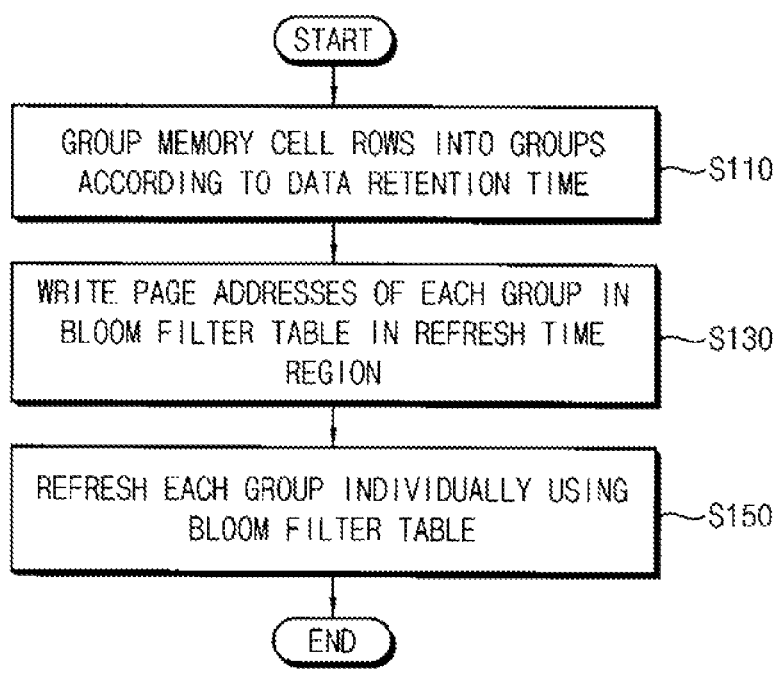
FIG. 1 is a flow chart illustrating a method of refreshing a volatile memory device according to an exemplary embodiment of the inventive concept.
Figure 2:
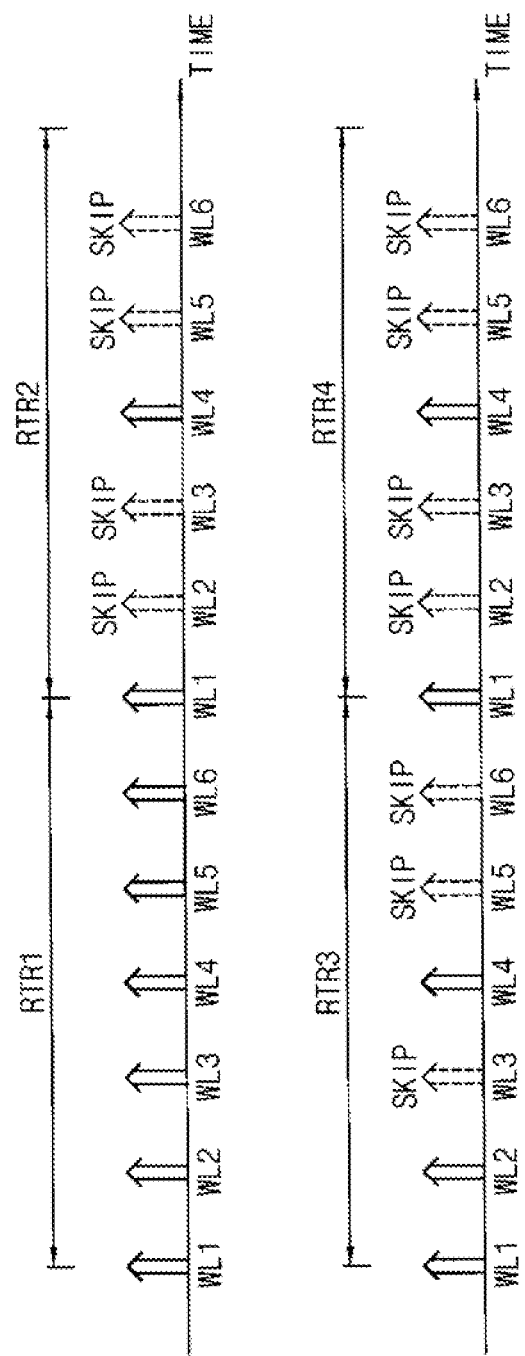
FIG. 2 illustrates a refresh operation according to an exemplary embodiment of the inventive concept.
Figure 3:
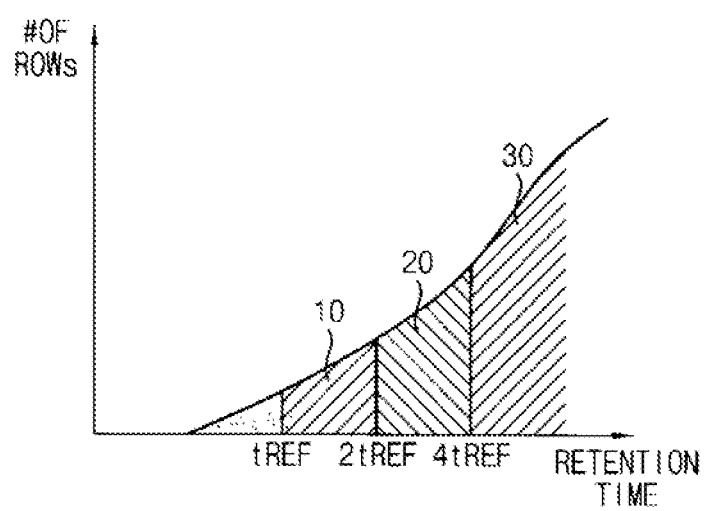
FIG. 3 is a diagram illustrating a distribution of memory cell rows according to a data retention time of memory cells included in each memory cell row, according to an exemplary embodiment of the inventive concept.

FIG. 1 is a flow chart illustrating a method of refreshing a volatile memory device according to an exemplary embodiment of the inventive concept, FIG. 2 illustrates a refresh operation according to an exemplary embodiment of the inventive concept, and FIG. 3 is a diagram illustrating a distribution of memory cell rows according to a data retention time of memory cells included in each memory cell row, according to an exemplary embodiment of the inventive concept.

Referring to FIGS. 1 and 2, a plurality of memory cell rows constituting a memory cell array are grouped into a plurality of groups based on a data retention time of the memory cell rows (S110). For example, when the memory cell array includes a plurality of memory cell rows WL1 to WL6, for the purpose of description, the memory cell rows WL1 and WL4 laving a data retention time of 64 ms to 128 ms are grouped into a first group, the memory cell row WL2 having a data retention time of 128 ms to 256 ms is grouped into a second group, and the memory cell rows WL3, WL5 and WL4 having a data retention time greater than 256 ms are grouped into a third group.

When the memory cell rows WL1 to WL6 are grouped into the first through third groups based on the data retention time, a plurality of refresh time regions (RTRs) (for example, first through k-th RTRs, where k is an integer equal to or greater than two) may be set based on the number of the groups. For example, when the number of groups is 3, the RTRs may be set to first through fourth RTRs, and the first through fourth RTRs may be periodically repeated. The memory cell rows to be refreshed are written in a bloom filter table in at least some of the RTRs (S130). Refresh row addresses of the memory cell rows in each of the RTRs are hashed. A memory cell row is refreshed when a hashing index matches a bloom filter table corresponding to each of the RTRs, and a refresh operation on the memory cell row is skipped when the hashing index does not match the bloom table corresponding to each of the RTRs. For example, each group is individually refreshed during its corresponding refresh period (S150).

Since all of the memory cell rows WL1 to WL6 are to be refreshed in the first RTR RTR1, a bloom filter table corresponding to the first RTR RTR1 is not needed. Since the memory cell rows WL1 and WL4 of the first group are to be refreshed in the second RTR RTR2, row addresses of the memory cell rows WL1 and WL4 are hashed, and hashed (or coded) outputs are written in a first bloom filter table associated with the second RTR RTR2. The hashed outputs have a smaller number of bits man the original row addresses, and the hashed outputs that have binary values include hashing indexes that have decimal values. Therefore, when a hashing index of the memory cell row matches the first bloom filter table, the corresponding memory cell row (such as WL1 and WL4) is refreshed in the second RTR RTR2. When a hashing index of the memory cell row does not match the first bloom filter table, a refresh operation of the corresponding memory cell row (such as WL2, WL3, WL5 and WL6) is skipped (as represented by SKIP) in the second RTR RTR2. Since the memory cell rows WL1, WL2 and WL4 of the third group are to be refreshed in the third RTR RTR3, row addresses of the memory cell rows WL1, WL2 and WL44 are hashed, and hashed outputs are written in a second bloom filter table associated with the third RTR RTR3. Therefore, when a hashing index of the memory cell row matches the second bloom filter table, the corresponding memory cell row (such as WL1, WL2 and WL4) is refreshed in the third RTR RTR3. When a hashing index of the memory cell row does not match the second bloom filter table, a refresh operation of the corresponding memory cell row (such as WL3, WL5 and WL6) is skipped in the third RTR RTR2. Since the memory cell rows WL1 and WL4 of the first group are again refreshed in the fourth RTR RTR4, a bloom filter table corresponding to the fourth RTR RTR4 may use the first bloom filter table associated with the second RTR RTR2.

According to an exemplary embodiment of the inventive concept, each of the first through third groups grouped from the memory cell rows WL1 to WL6 is individually refreshed during its corresponding refresh period using the first and second bloom filter tables respectively associated with the second and third RTRs RTR2 and RTR3.

Referring to FIG. 3, the memory cell rows 10 of the first group having a data retention time between tREF and 2tREF (tREF is a refresh period) are refreshed in all of the first through fourth RTRs RTR1 to RTR4, and the memory cell rows 20 of the second group having a data retention time between 2tREF and 4tREF are refreshed in the first RTR RTR1. Therefore, when the memory cell rows are grouped into the groups according to their data retention time and each of the groups is individually refreshed during its corresponding refresh period, the refresh period of the memory cell row 30 of the third group to which most of the memory cell rows belong may be four times as long as the refresh period tREF. Therefore, refresh current may be reduced, and performance of the memory device may be enhanced.

Figure 4A:
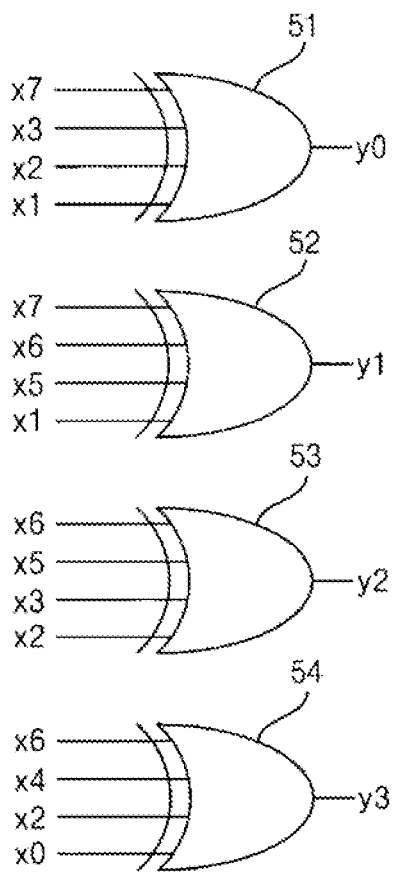
FIG. 4A illustrates a hashing logic according to an exemplary embodiment of the inventive concept.

FIG. 4A illustrates a hashing logic according to an exemplary embodiment of the inventive concept.

Referring to FIG. 4A, an 8-bit input x0 to x7 is coded into a 4-bit output y0 to y3 using a hash table 40, and the coded 4-bit output y0 to y3 may be written in a bloom filter table.

In FIG. 4A, the reference numeral 50 represents XOR gates 51, 52, 53 and 54 for implementing the hash table 40.

FIG. 4B illustrates hashed outputs using the hash table of FIG. 4A, according to an exemplary embodiment of the inventive concept, and FIG. 4C illustrates a bloom filter table in which the hashed outputs in FIG. 4B are written according to an exemplary embodiment of the inventive concept.

Referring to FIG. 4B, each of weak page addresses 61 (WEAK_ADDR1 to WEAK_ADDR5) of memory cell rows including at least one weak cell with a shorter data retention time than fee data retention time of normal cells include 8 bits X0 to X7. When the weak page addresses 61 are hashed using the hash table 61, hashed outputs 63 are obtained, and each of the hashed outputs include 4 bits Y0 to Y3. When fee weak page address WEAK_ADDR1 is hashed, the hashed output is '0010' corresponding to a decimal value, 2. For example, the hashing index of the weak page address WEAK_ADDR1 is 2. When fee weak page address WEAK_ADDR2 is hashed, the hashed output is '0011' corresponding to a decimal value, 3. For example, the hashing index of the weak page address WEAK_ADDR2 is 3. When the weak page address WEAK_ADDR3 is hashed, fee hashed output is '0101' corresponding to a decimal value, 5. For example, fee hashing index of the weak page address WEAK_ADDR3 is 5. When the weak page address WEAK_ADDR4 is hashed, the hashed output is '0110' corresponding to 6 in decimal value. For example, hashing index of the weak page address WEAK_ADDR4 is 6. When the weak page address WEAK_ADDR5 is hashed, the hashed output is '1001' corresponding to a decimal value, 9. For example, the hashing index of the weak page address WEAK_ADDR5 is 9.

Referring to FIG. 4C, a bloom filter table 70 includes a first column in which the hashing indexes INDEX are written and a second column in which match values MV corresponding to the hashing indexes INDEX are written. The match values MV corresponding to the hashing indexes INDEX of the weak page addresses WEAK_ADDR1 to WEAK_ADDR5 are written as '1', and the match values MV corresponding to other hashing indexes INDEX are written as '0'. After the bloom filter table 70 is programmed by hashing the weak page addresses WEAK_ADDR1 to WEAK_ADDR5, when a first hashing index of a first refresh row address matches the bloom filter table 70 (for example, when MV is '1'), a memory cell row corresponding to the first refresh row address is refreshed in a refresh operation. When a second hashing index of a. second refresh row address does not match the bloom filter table 70 (for example, when MV is '0'), a memory cell row corresponding to the second refresh row address is not refreshed in the refresh operation. For example, the refresh operation on the memory cell row corresponding to the second refresh row address is skipped. The reference numeral 71 in FIG. 4C represents that a hashing index does not match the bloom filter table 70, and the reference numeral 72 in FIG. 4C represents that hashing indexes match the bloom filter table 70. The reference numeral 73 indicates a 'false positive' in which a hashing index of a page address of a normal page matches the bloom filter table 70. The 'false positive' may occur in the hashing logic 50. Although the bloom filter table 70 has the 'false positive', the refresh operations on the weak page addresses are not missed.

When the weak page addresses WEAK_ADDR1 to WEAK_ADDR5 are stored using the bloom filter table 70, a storage area may be greatly reduced.

Figure 4D:
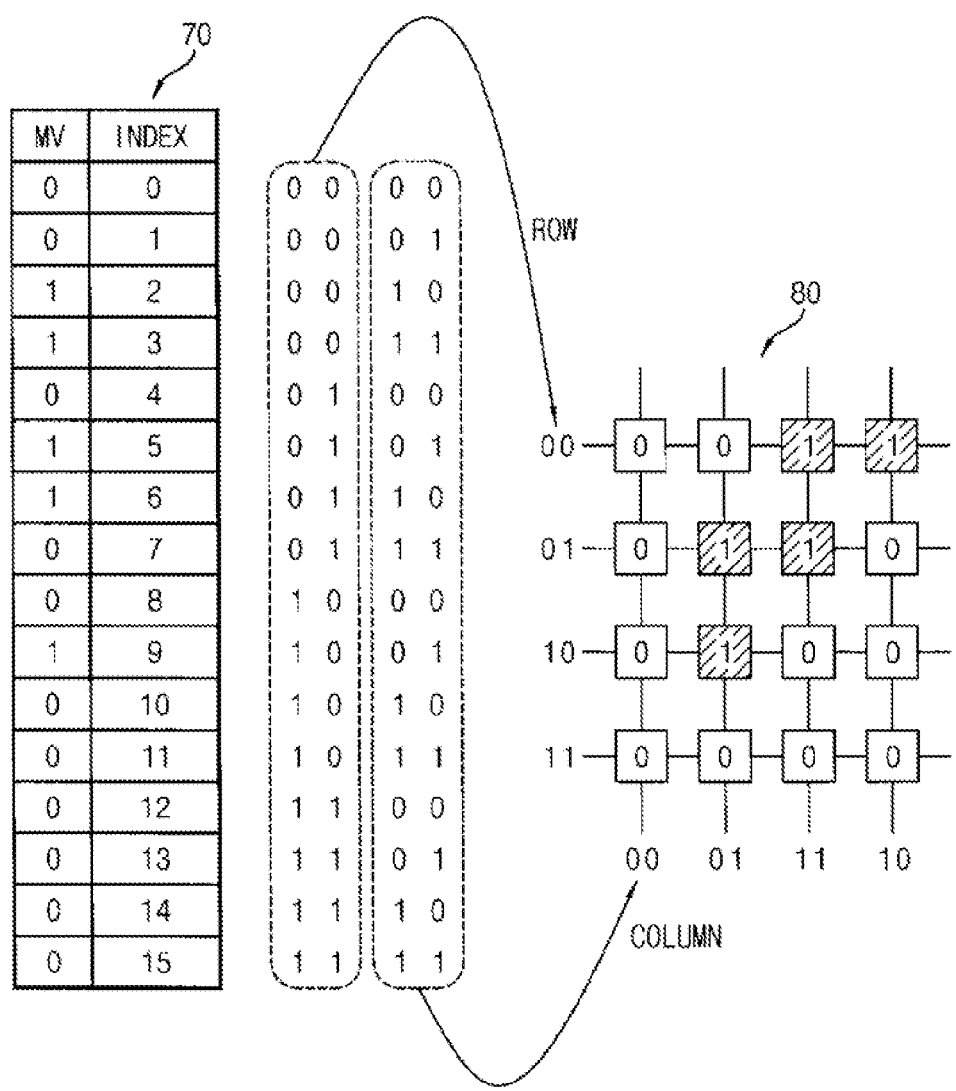
FIG. 4D illustrates a bloom filter table of FIG. 4C according to an exemplary embodiment of the inventive concept.

FIG. 4D illustrates a bloom filter table of FIG. 4C according to an exemplary embodiment of the inventive concept.

Referring to FIG. 4D, when indexes INDEX of the bloom filter table 70 are represented with 4-bit binary values, the upper 2-bits are mapped to rows ROW, and the lower 2-bits are mapped to columns COLUMN. When the hashing index has a match value MV of '1', '1' is written in an intersection point of its corresponding row and column. When the hashing index has a match value MV of '0', '1' is written in an intersection point of its corresponding row and column. A bloom filter table 80 may be configured in an array structure as illustrated in FIG. 4D.

Figure 5:
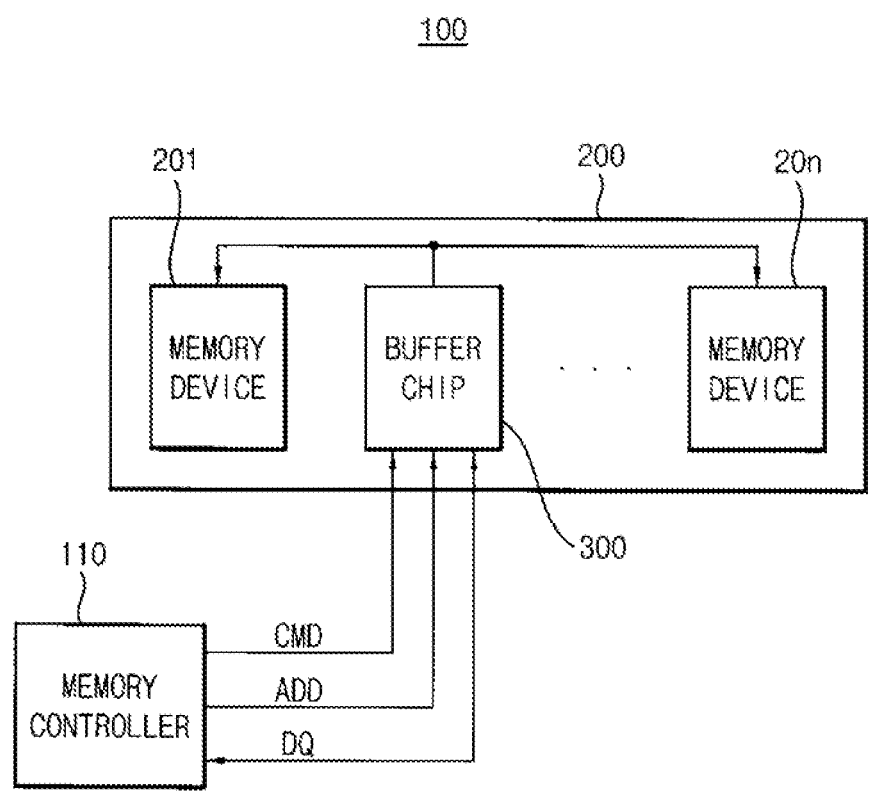
FIG. 5 is a block diagram illustrating a memory system according to an exemplary embodiment of the inventive concept.

FIG. 5 is a block diagram illustrating a memory system according to an exemplary embodiment of the inventive concept.

Referring to FIG. 5, a memory system 100 includes a memory controller 110 and a memory module 200. The memory module 200 includes a plurality of memory devices 201 to 20n and a buffer chip 300. The memory controller 110 provides various signals, e.g., a command CMD, an address ADD, and a clock signal CLK, for controlling the semiconductor device included in the memory module 200, and the memory controller 110 can communicate with the memory module 200 to provide data DQ to the memory module 200 or to receive the data DQ from the memory module 200.

Each of the memory devices 201 to 20n includes a memory cell array, and the memory cell array can be divided into a plurality of regions. For example, each memory cell army includes a plurality of banks, and each region is defined as one of the banks. The memory cell array may include a plurality of ranks, and each region is defined as a rank. A page (of data) in light of the memory module 200, e.g., a DRAM module, can refer to a data block which is moved from a group of the memory cells, e.g., DRAM cells, to a bit line sense amplifier upon application of a row address strobe (RAS) active command. Therefore, the memory cell army may include a plurality of pages.

The buffer chip 300 directly and/or indirectly can control each of the memory devices 201 to 20n. Various techniques for increasing memory performance are used in the buffer chip 300. For example, functional blocks for performing operations in accordance with techniques related to finite data retention (e.g., refresh policy) are used in the buffer chip 300. The buffer chip 300 receives the command CMD and the address from the memory controller 110, and the buffer chip 300 provides the command CMD and the address to the memory devices 201 to 20n. The buffer chip 300 transfers the data DQ from the memory devices 201 to 20n to the memory controller 110. The buffer chip 300 may group the memory cell rows of the memory devices 201 to 20n into a plurality of groups according to their data .retention times, and the buffer chip 300 may individually the groups during a corresponding refresh period using bloom filter tables when the buffer chip 300 performs refresh operation on the memory devices 201 to 20n.

Figure 6:
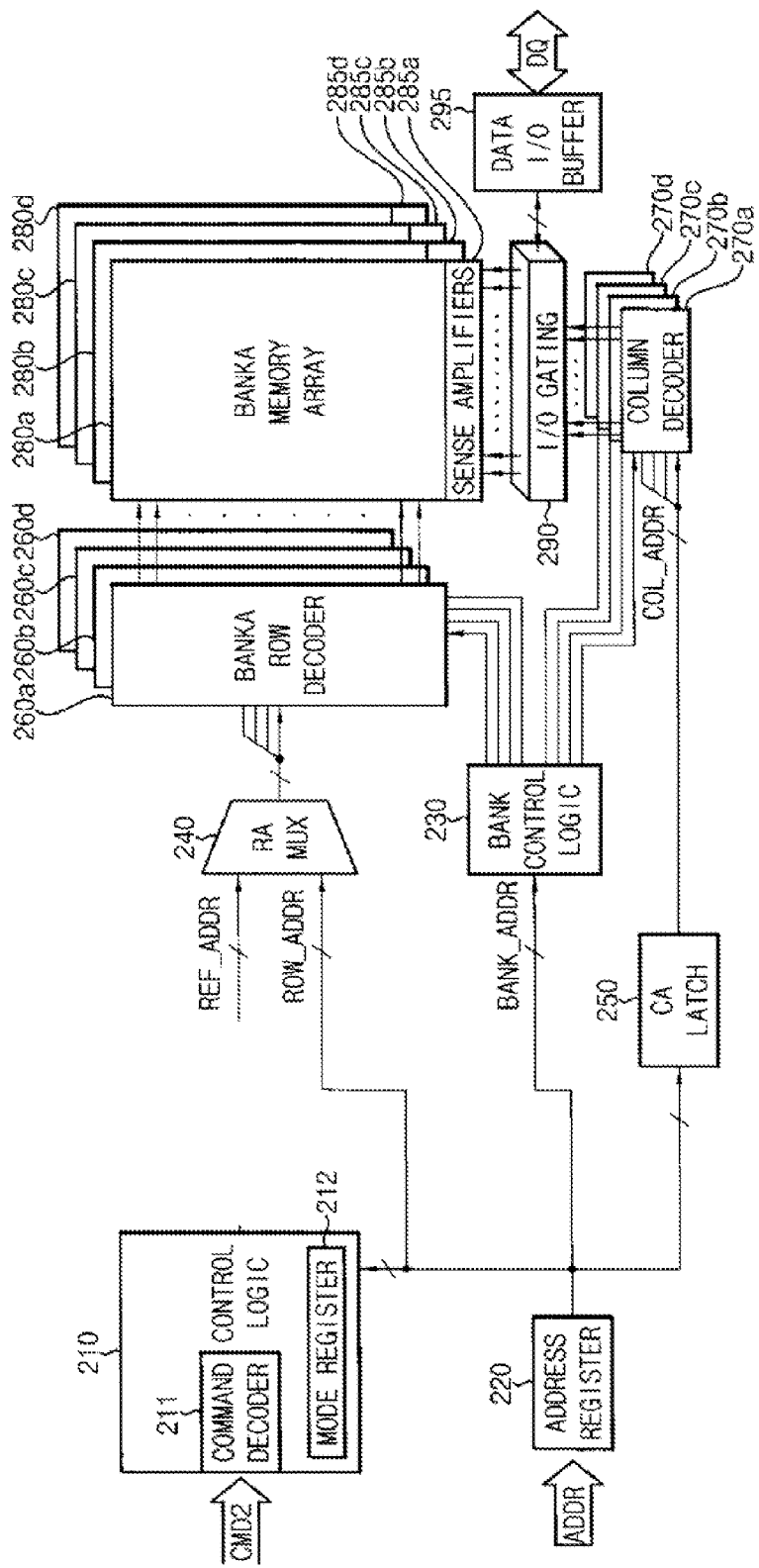
FIG. 6 is a block diagram illustrating one of the memory devices in FIG. 5 according to an exemplary embodiment of the inventive concept

FIG. 6 is a block diagram illustrating one of the memory devices in FIG. 5 according to an exemplary embodiment of the inventive concept.

Referring to FIG. 6, the memory device 201 includes a control logic 210, an address register 220, a bank control logic 230, a row address multiplexer 240, a column address latch 250, a row decoder, a column decoder, a memory cell array, a sense amplifier unit, an input/output gating circuit 290 and a data input/output buffer 295. In an exemplary embodiment of the inventive concept, the memory device 201 may include a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), and/or a Rambus™ dynamic random access memory (RDRAM), or the memory device 201 may include other volatile memory devices that perform a refresh operation.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d. The column decoder may include first through fourth bank column decoders 270a, 270b, 270c and 270d respectively coupled to the first through fourth bank arrays 280a, 280b, 280c and 280d. The sense amplifier unit may include first through fourth bank sense amplifiers 285a, 285b, 285c and 285d respectively coupled to the first through fourth bank arrays 280a, 280b, 280c and 280d. The first through, fourth bank arrays 280a, 280b, 280c and 280d, the first through fourth bank row decoders 260a, 260b, 260c and 260d. the first through fourth bank column decoders 270a, 270b, 270c and 270d and the first through fourth bank sense amplifiers 285a, 285b, 285c and 285d may form first through fourth banks. Although the memory device 201 is illustrated in FIG. 6 as including four banks, the memory device 201 may include any number of banks.

The address register 220 may receive an address ADDR including a bank address BANK_ADDR, a row address ROW_ADDR and a column address COL_ADDR from a memory controller. The address register 220 may provide the received bank address BANK_ADDR to the bank control logic 230. The address register 220 may provide the received row address ROW_ADDR to the row address multiplexer 240. The address register 220 may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to fee bank control signals.

The row address multiplexer 240 may receive the row address ROW_ADDR from the address register 220, and the row address multiplexer 240 may receive a refresh row address REF_ADDR. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated bank row decoder among the first, through fourth bank row decoders 260a, 260b, 260c and 260d may decode the row address output from the row address multiplexer 240, and the activated bank row decoder may activate a word line corresponding to the row address. For example, the activated bank row decoder may apply a word line driving voltage to the word line corresponding to the row address.

The column address latch 250 may receive the column address COL_ADDR from the address register 220, and the column address latch 250 may temporarily store the received column address COL_ADDR. In an exemplary embodiment of the inventive concept, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated bank column decoder among the first through fourth bank column decoders 270a, 270b, 270c and 270d may decode the column address COL_ADDR output from the column address latch 250, and the activated bank column decoder may control the input/output gating circuit 290 to output data corresponding to the column address COL_ADDR.

The input/output gating circuit 290 may include circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the bank army, and the data DQ may be stored in the read data latches. The data DQ stored in the read data latches may be provided to the memory controller via the data input/output buffer 295. Data DQ to be written to one bank array of the first through fourth bank arrays 280a, 280b, 280c and 280d may be provide from the buffer chip to the data input/output buffer 295. The data DQ provided to the data input/output buffer 295 may be written to the one array bank via the write drivers.

The control logic 210 may control operations of the memory device 201. For example, the control logic 210 may generate control signals for the memory device 201 to perform a write operation or a read operation. The control logic 210 may include a command decoder 211 that decodes a command CMD received from the memory controller and a mode register 212 that sets an operation mode of the memory device 201. For example, the command decoder 211 may generate the control signals corresponding to the command CMD by decoding a write enable signal (/WE), a row address strobe signal (/RAS), a column address strobe signal (/CAS), and/or a chip select signal (/CS). The command decoder 211 may further receive a clock signal (CLK) and a clock enable signal (/CKE) for synchronously operating the memory device 201.

Figure 7:
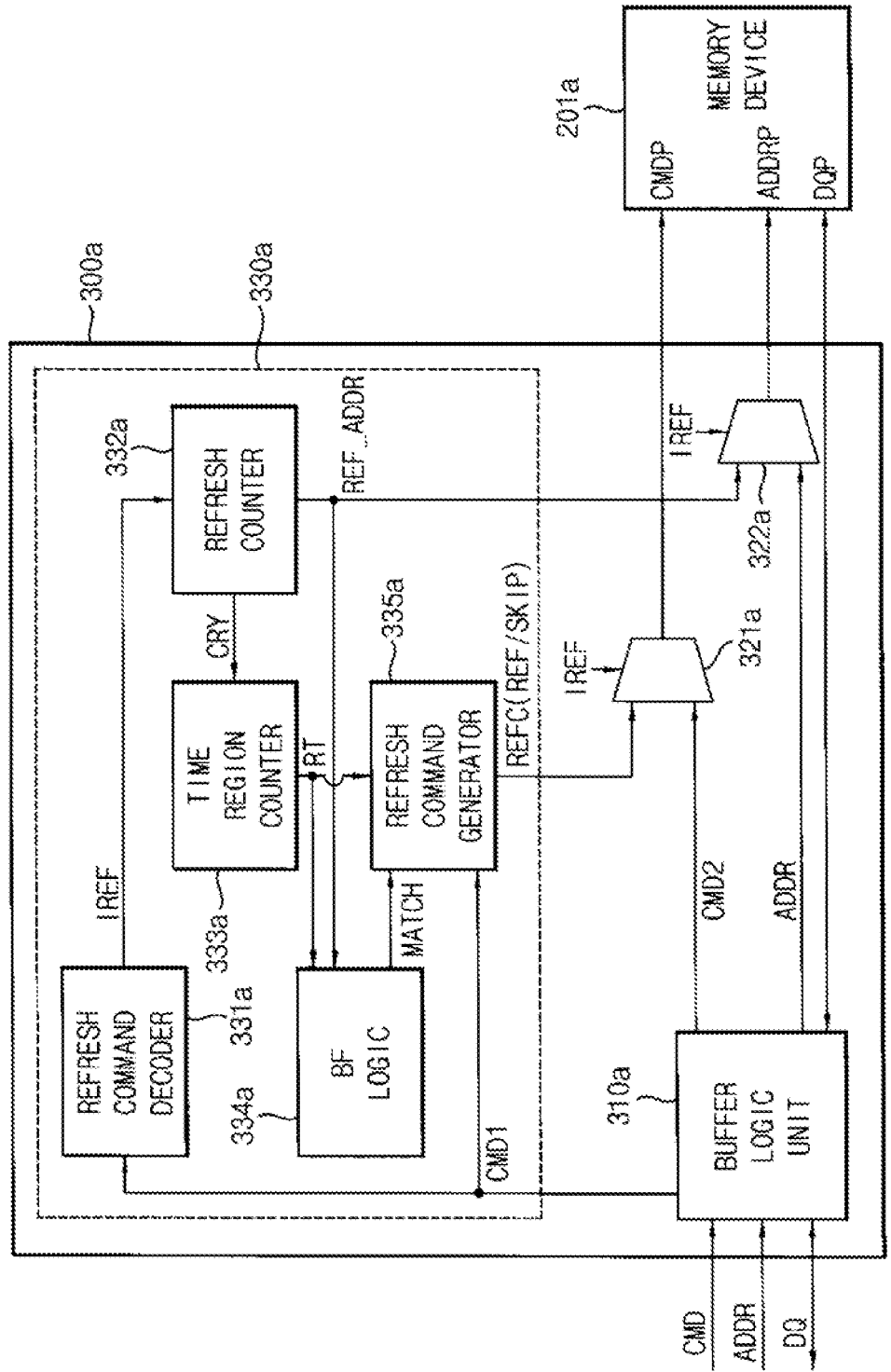
FIG. 7 illustrates connection relationship between a buffer chip and one of the memory devices in FIG. 5 according to an exemplary embodiment of the inventive concept.

FIG. 7 illustrates a connection relationship between a buffer chip and one of the memory devices in FIG. 5 according to an exemplary embodiment of the inventive concept.

Referring to FIG. 7, a buffer chip 300a includes a buffer logic unit 310a, first and second multiplexers 321a and 322a and a refresh control circuit 330a.

The buffer logic unit 310a provides a command CMD from the memory controller 110 to the refresh control circuit 330a as a first command CMD1 or the buffer logic unit 310a provides the command CMD to the first multiplexer 321a as a second command CMD2 based on whether the command CMD is associated with a refresh operation. When the command CMD is associated with the refresh operation, the buffer logic 310a provides the command CMD to the refresh control circuit 330a as the first command CMD1. When the command CMD is not associated with the refresh operation but is associated with an act/write/read/precharge/power-down operation, the buffer logic 310a provides the command CMD to the first multiplexer 321a as the second command CMD2. The buffer logic unit 310a buffers an address ADDR and provides the address ADDR to the second multiplexer 322a.

The refresh control circuit 330a may includes a refresh command decoder 331a, a refresh counter 332a, a time region counter 333a, a bloom filter logic 334a and a refresh command generator 335a.

The refresh command decoder 331a decodes the first command CMD1 to generate an internal refresh command IREF. The refresh counter 332a generates a refresh row address REF_ADDR that gradually increments or decrements in response to the internal refresh command IREF. The refresh counter 332a generates a carry bit CRT whenever the refresh row address REF_ADDR has its maximum/minimum value. The time region counter 333a provides a RTR signal RT indicating one of a plurality of RTRS that are periodically repeated in response to the carry bit CRY. The bloom filter logic 334a includes a hashing logic and a bloom filter table unit including a plurality of bloom filter tables. Each of the bloom filter tables stores hashing indexes representing page addresses of the memory cell rows to be refreshed in each of RTRs.

The bloom filter table unit provides the refresh command generator 335a with a match signal MATCH indicating whether the refresh row address REF_ADDR matches the bloom filter tables. The refresh command generator 335a may generate a refresh command REFC that determines whether the memory cell row corresponding to the refresh row address REF_ADDR is to be refreshed based on the match signal MATCH and the RTR signal RT.

For example, when the refresh row address REF_ADDR matches the bloom filter table unit, the refresh command generator 335a may generate a refresh enable command REF that refreshes a corresponding memory cell row. When the refresh row address REF_ADDR does not match the bloom filter table unit, the refresh command generator 335a may generate a skip command REF that enables a .refresh operation for the corresponding memory cell row to be skipped.

The first multiplexer 321a selects one of the refresh command REFC and the second command CMD2 and provides the selected command to a command pin CMDP of the memory device 201a in response to the internal refresh command IREF. For example, when the internal refresh command IREF is at a high level because the command CMD is associated with the refresh operation, the first multiplexer 321a selects the refresh command REFC. When the internal refresh command IREF is at a low level because the command CMD is associated with a normal operation, the first multiplexer 321a selects the second command CMD2. The first multiplexer 322a selects one of the refresh row address REF_ADDR and the address ADDR and provides the selected address to an address pin ADDRP of the memory device 210a in response to the internal refresh command IREF. For example, when the internal refresh command IREF is at a high level because the command CMD is associated with the refresh operation, the second multiplexer 322a selects the refresh row address REF_ADDR. When the internal refresh command IREF is at a low level because the command CMD is associated with normal operation, the second multiplexer 322a selects the address ADDR.

Figure 8:
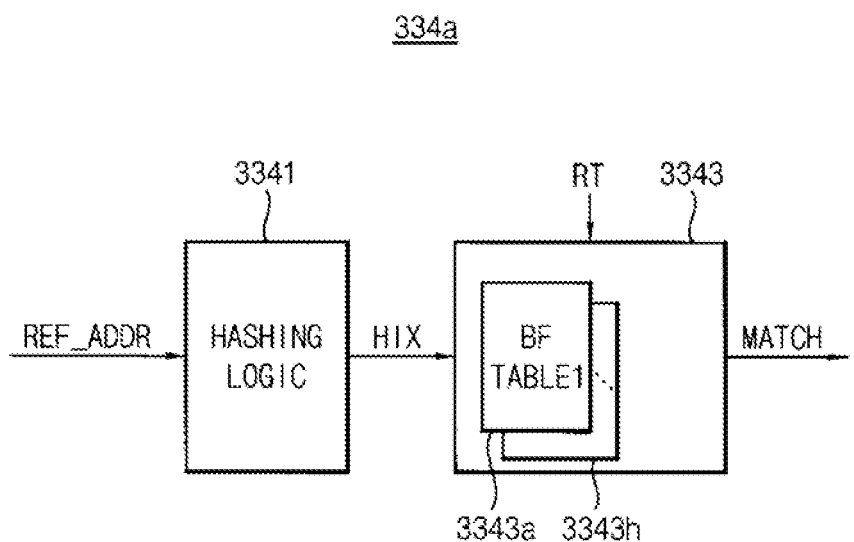
FIG. 8 is a block diagram illustrating a bloom filter logic in FIG. 7 according to an exemplary embodiment of the inventive concept.

FIG. 8 is a block diagram illustrating a bloom filter logic in FIG. 7 according to an exemplary embodiment of the inventive concept.

Referring to FIG. 8, the bloom filter logic 334a includes a hashing logic 3341 and a bloom filter table unit 3343.

The hashing logic 3341 includes a plurality of XOR gates implementing the hashing table 40 as shown in FIG. 4, and the hashing logic 3341 hashes the refresh row address REF_ADDR to generate a hashing index HIX associated with the refresh row address REF_ADDR. The bloom filter table unit 3343 includes a plurality of bloom filter tables 3343a to 3343n. Each of the bloom filter tables 3343a to 3343h may store hashed page addresses to be refreshed in at least some of the RTRs that are periodically refreshed. Each of the bloom filter tables 3343a to 3343h may be selected in response to the RTR signal RT to provide the match signal MATCH indicating whether the hashing index HIX of the refresh row address REF_ADDR matches the associated bloom filter table.

Before or after the memory module 200 is packaged, page addresses of the memory cell rows are hashed and are written in the bloom filter tables 3343a to 3343h according to test results of the memory cell rows. In this case, the bloom filter tables 3343a to 3343h may be nonvolatile memory devices. After the memory module 200 is manufactured, the page addresses of the memory cell rows are hashed and are written in the bloom filter tables 3343a to 3343h through an external test or built-in self test during a power-up sequence of the memory module 200. In this case, the bloom filter tables 3343a to 3343h may be volatile memory devices.

For the purpose of description, the memory cell rows of the memory cell array 280a to 280d are grouped into the first through third groups based on the data retention time as illustrated in FIG. 3. When the memory cell rows are grouped into the first through third groups, the RTRs include first through fourth RTRs.

Since all of the memory cell rows are to be refreshed in the first RTR RTR1, a bloom filter table associated with the first RTR RTR1 is not needed. Since the memory cell rows in the first group are to be refreshed in the second RTR RTR2, row addresses of the memory cell rows in the first group are hashed and are written in a bloom filter table 3343a associated wife the second RTR RTR2. Since the memory cell rows in the first and second groups are to be refreshed in the third RTR RTR3, row addresses of the memory cell rows in the first and second groups are hashed and are written in a bloom filter table 3343b associated with fee second RTR RTR2.

Since the memory cell rows in the first group are to be refreshed again in the fourth RTR RTR4, row addresses of the memory cell rows in the second group are hashed and are written in a bloom filter fable 3343c associated with the second RTR RTR2. Alternatively, the bloom filter table 3343 may be used again.

A refresh operation is initiated, and the refresh counter 332a sequentially generates the refresh row address REF_ADDR. Since the refresh row address REF_ADDR is associated with the first RTR RTR1, the carry bit CRY is '00'. When the carry bit CRY is '00', the refresh command generator 335a generates the .refresh enable command REF with respect to all of the refresh row address REF_ADDR. The first multiplexer 321a selects the refresh enable command REF and provides fee selected refresh enable command REF to the memory device 201a in response to the internal refresh command IREF. The second multiplexer 322a selects the refresh row address REF_ADDR and provides the selected refresh row address REF_ADDR to the memory device 201a in response to the internal refresh command IREF. The memory device 201 refreshes all memory cell rows corresponding to the refresh row address REF_ADDR in response to the refresh enable command REF in the first RTR RTR1.

When the output of the refresh counter 332a has its maximum value, the carry bit CRY increases to '01'. The time region counter 333a provides the bloom filter logic 334a and the refresh command generator 335a with the RTR signal RT indicating the second RTR RTR2 in response to the carry bit CRY having '01'. The bloom filter table 3343a is selected in response to the RTR signal RT, and the hashing logic 3341 hashes the refresh row address REF_ADDR to generate the hashing index HIX. Since the match value MV in die bloom filter table 3343a is '1' with respect to the memory cell rows of the first group, the bloom filter table 3343a provides the refresh command generator 335a with the match signal MATCH with a high level when the hashing indexes HIX of the memory cell rows of the first group indicate the bloom filter table 3343a. The refresh command generator 335a provides the first multiplexer 321a with the refresh enable command REF in response to the match signal MATCH having high level.

Therefore, the refresh command generator 335a provides the first multiplexer 321a with the refresh enable command REF whenever the refresh row address REF_ADDR of the memory cell rows of the first group is provided to the second multiplexer 322a in the second RTR RTR2. The refresh command generator 335a provides the first multiplexer 321a with the skip command SKIP whenever the refresh row address REF_ADDR of the memory cell rows except the first group is provided to the second multiplexer 322a in the second RTR RTR2.

The bloom filter table 3343b is selected in response to the RTR signal RT in fee third RTR RTR3, and the memory device 201a refreshes fee memory cell rows of the first and second groups. The bloom filter table 3343b is selected in response to the RTR signal RT in the fourth RTR RTR4, and the memory device 201a refreshes the memory cell rows of fee first group.

Figure 9:
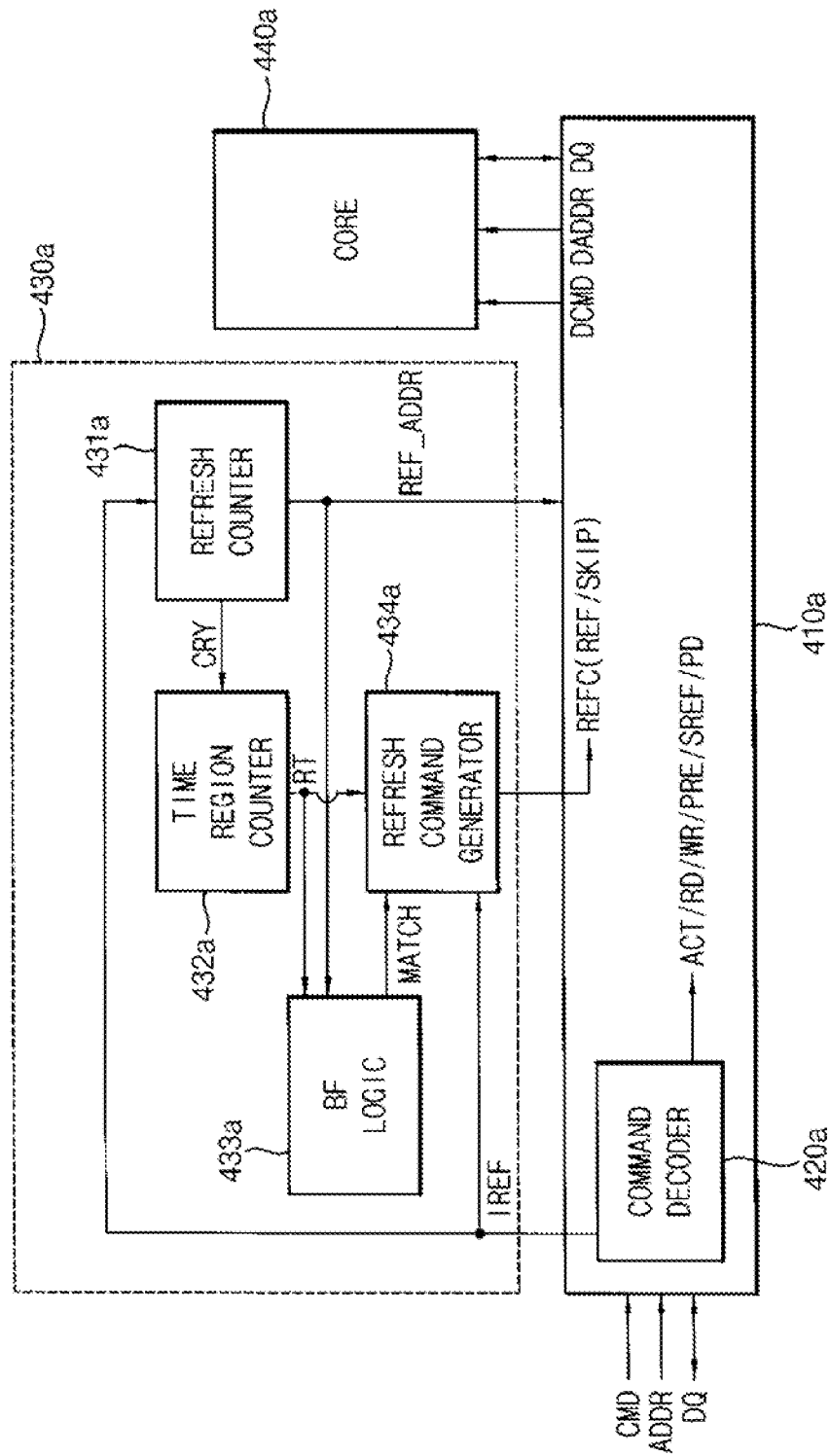
FIG. 9 is a block diagram illustrating a memory device according to an exemplary embodiment of the inventive concept.

FIG. 9 is a block diagram illustrating a memory device according to an exemplary embodiment of the inventive concept.

Referring to FIG. 9, a memory device 400a includes a command/address logic and data path 410a, a refresh control circuit 430a and a memory core 440a. The memory core 440a may include a row decoder, a column decoder, a memory cell array and a sense amplifier and the command/address logic and data path 410a includes a command decoder 420a, an address decoder and an I/O circuit. The command decoder 420a decodes the command CMD for an external memory controller and provides an internal refresh command to the refresh control circuit 430a or provides act ACT, read RD, write WR, precharge PRE, self refresh SREF and power-down PD commands to the memory core 440a as decoded commands.

The refresh control circuit 430a may include a refresh counter 431a, a time region counter 432a, a bloom filter logic 433a and a refresh command generator 434a. The refresh counter 431a generates a refresh row address REF_ADDR that gradually increments or decrements in response to fee internal refresh command IREF. The refresh counter 431a generates a carry bit CRT whenever fee refresh row address REF_ADDR has its maximum/minimum value. The time region counter 432a provides a RTR signal RT indicating one of a plurality of RTRS that are periodically repeated in response to the carry bit CRY.

The bloom filter logic 433a includes a hashing logic and a bloom filter table unit including a plurality of bloom filter tables as shown in FIG. 8. Each of the bloom filter tables stores hashing indexes representing page addresses of the memory cell rows to be refreshed in each of RTRs. The bloom filter table unit provides the refresh command generator 434a with a match signal MATCH indicating whether the refresh row address REF_ADDR matches the bloom filter tables. The refresh command generator 434a may generate a refresh command REFC that determines whether the memory cell row corresponding to the refresh row address REF_ADDR is to be refreshed based on the match signal MATCH and the RTR signal RT.

The command/address logic and data path 410a may include the first and second multiplexers as illustrated in FIG. 7, and the command/address logic and data path 410a may provide the memory core 440a with the refresh command REFC and the refresh row address REF_ADDR during the refresh operation of the memory cell array in the memory core 440a. The memory core 440a refreshes the memory cell row corresponding to the refresh row address REF_ADDR when the refresh command REFC is a refresh enable command REF. The memory core 440a skips the refresh operation for the memory cell row corresponding to the refresh row address REF_ADDR when the refresh command REFC is a skip command SKIP. The refresh control circuit 400a may perform auto refresh operation in the memory device 400a.

Figure 10:
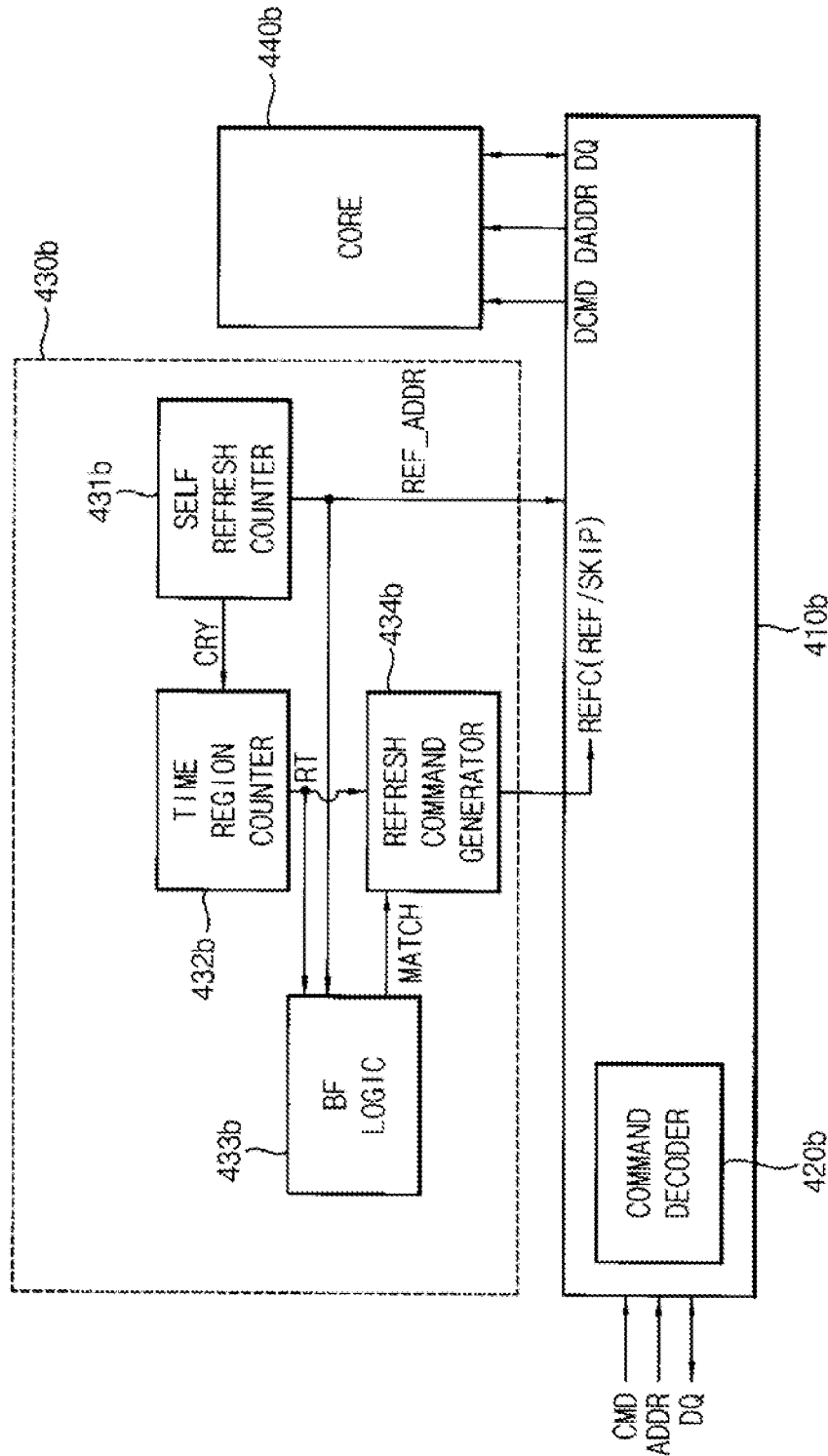
FIG. 10 is a block diagram illustrating a memory device according to an exemplary embodiment of tire inventive concept.

FIG. 10 is a block diagram illustrating a memory device according to an exemplary embodiment of the inventive concept.

Referring to FIG. 10, a memory device 400b includes a command/address logic and data path 410b, a refresh control circuit 430b and a memory core 440b. The memory core 440b may include a row decoder, a column decoder, a memory cell array and a sense amplifier and the command/address logic and data path 410b includes a command decoder 420b, an address decoder and an I/O circuit. The command decoder 420b decodes the command CMD for an external memory controller to provide an internal refresh command to the refresh control circuit 430b or to provide act ACT, read RD, write WR, precharge PRE, self refresh SREF and power-down PD commands to the memory core 440b as decoded commands.

The refresh control circuit 430b may include a self refresh counter 431b, a time region counter 432b, a bloom filter logic 433b and a refresh command generator 434b. The self refresh counter 431b generates a refresh row address REF_ADDR that gradually increments or decrements when the memory device 400b enters into the power-down mode. The refresh counter 431b generates a carry bit CRT whenever the refresh row address REF_ADDR has its maximum/minimum value. The time region counter 432b provides a RTR signal RT indicating one of a plurality of RTRS that are periodically repeated in response to the carry bit CRY. The bloom filter logic 433b includes a hashing logic and a bloom filter table unit including a plurality of bloom filter tables as shown in FIG. 8. Each of the bloom filter tables stores hashing indexes representing page addresses of the memory cell rows to be refreshed in each of RTRs. The bloom filter table unit provides the refresh command generator 434b with a match signal MATCH indicating whether the refresh row address REF_ADDR matches the bloom filter tables. The refresh command generator 434b may generate a refresh command REFC that determines whether the memory cell row corresponding to the refresh row address REF_ADDR is to be refreshed based on the match signal MATCH and the RTR signal RT.

The memory core 440b refreshes the memory cell row corresponding to the refresh row address REF_ADDR when the refresh command REFC is a refresh enable command REF. The memory core 440b skips the refresh operation for tire memory cell row corresponding to the refresh row address REF_ADDR when the refresh command REFC is a skip command SKIP. The refresh control circuit 400b may perform a self refresh operation in the memory device 400b.

Figure 11:
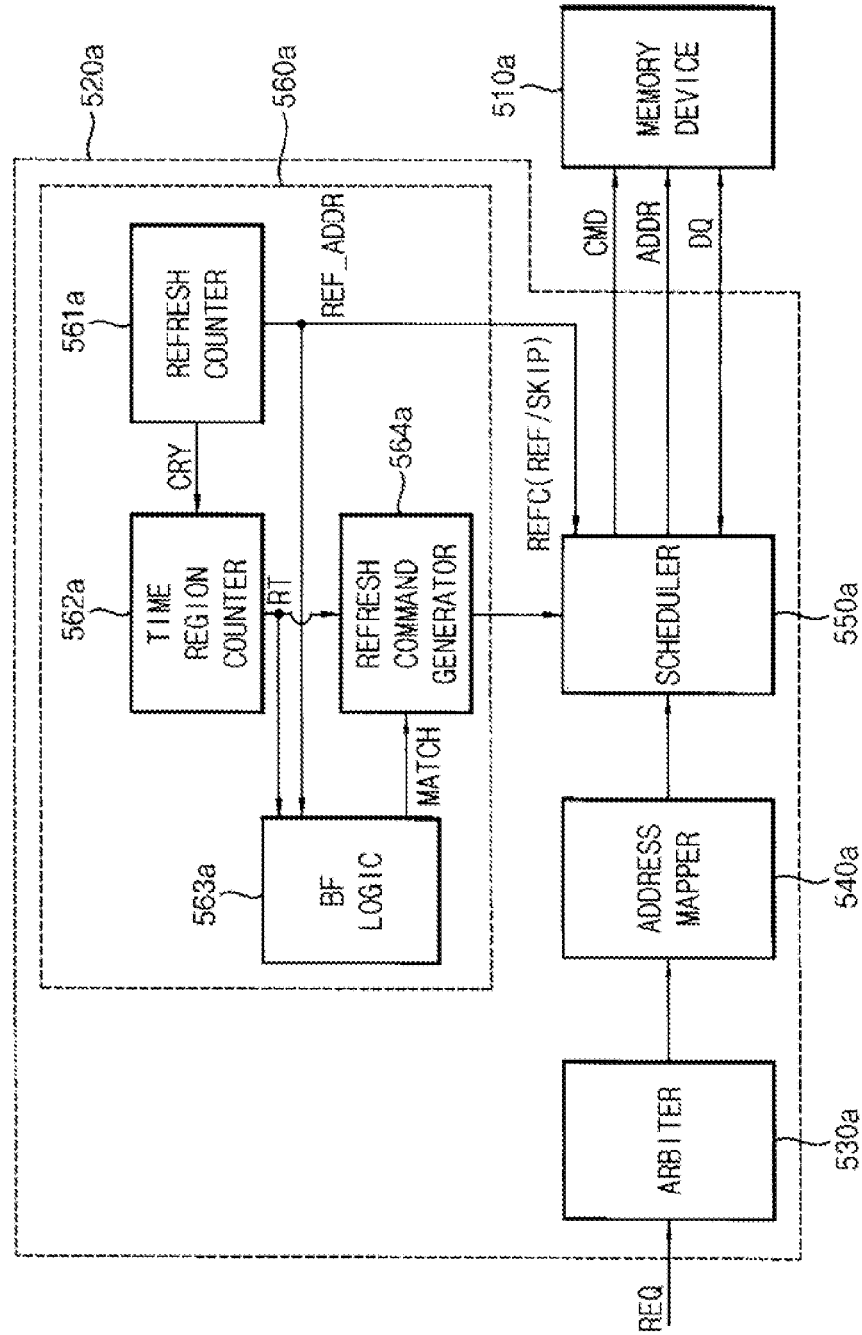
FIG. 11 is a block diagram illustrating a memory system according to an exemplary embodiment of the inventive concept.

FIG. 11 is a block diagram illustrating a memory system according to an exemplary embodiment of the inventive concept.

Referring to FIG. 11, a memory system 500a includes a memory device 510a and a memory controller 520a that controls fee memory device 510a. The memory controller 520a includes an arbiter 530a, an address mapper 540a, a scheduler 550a, and a refresh control circuit 560a.

The arbiter 530a outputs virtual addresses in response to a request REQ from a host. The address mapper 540a maps the virtual addresses to logical addresses ADDR for accessing the memory device 510a. The scheduler 550a schedules the logical address ADDR and command CMD based on a refresh command REFC and a refresh row address REF_ADDR from the refresh control circuit 560a, provides the scheduled logical address ADDR and command CMD to the memory device 510a, and exchanges data DQ with the memory device 510a.

The refresh control circuit 560a may include a refresh counter 561a, a time region counter 562a, a bloom filter logic 563a, and a refresh command generator 564a. The refresh counter 561a generates a refresh row address REF_ADDR drat gradually increments or decrements at refresh timing of the memory device 510a. The refresh counter 561a generates a carry bit CRY whenever the refresh row address REF_ADDR has its maximum/minimum value. The time region counter 562a provides a RTR signal RT indicating one of a plurality of RTRS that are periodically repeated in response to the carry bit CRY.

The bloom filter logic 563a includes a hashing logic and a bloom filter table unit including a plurality of bloom filter tables as shown in FIG. 8. Each of the bloom filter tables stores hashing indexes representing page addresses of the memory cell rows to be refreshed in each of RTRs. The bloom filter table unit provides the refresh command generator 564a with a match signal MATCH indicating whether the refresh row address REF_ADDR matches the bloom filter tables. The refresh command generator 564a may generate a refresh command REFC that determines whether the memory cell row corresponding to the refresh row address REF_ADDR is to be refreshed based on the match signal MATCH and the RTR signal RT.

For purpose of description, the memory cell rows of the memory device 510a are grouped into the first through third groups based on their data retention time as illustrated in FIG. 3. When the memory cell rows are grouped into the first through third groups, the RTRs include first through fourth RTRs as in FIG. 2.

An auto refresh operation is initiated, and the refresh counter 561a sequentially generates the refresh row address REF_ADDR. Since the refresh row address REF_ADDR is associated with the first RTR RTR1, the carry bit CRY is '00'. When the carry bit CRY is '00', the refresh command generator 564a generates the refresh enable command REF for all of the refresh row address REF_ADDR. The scheduler 550a schedules an operation of the memory device 510a considering a refresh operation for all of the memory cell rows of the memory device 510a.

When the output of the refresh counter 561a has its maximum value, the carry-bit CRY increases to '01'. The time region counter 562a provides the bloom filter logic 563a and the refresh command generator 564a with the RTR signal RT indicating the second RTR RTR2 in response to the carry bit CRY having '01'. The bloom filter table is selected in response to the RTR signal RT, and the hashing logic hashes the refresh row address REF_ADDR to generate the hashing index. Since the match value MV in the bloom filter table is '1' with respect to the memory cell rows of the first group, the bloom filter table provides fee refresh command generator 564a with the match signal MATCH with a high level when the hashing indexes of the memory cell rows of the first group indicate the bloom filter table. The refresh command generator 564a provides the scheduler 550a with the refresh enable command in response to the match signal MATCH having a high level. Since refresh operation is to be performed on the memory cell rows of the first group in the second RTR RTR2, the scheduler 550a schedules an operation of the memory device 510a considering the refresh operation of the memory cell rows in the first group of the memory device 510a.

The scheduler 550a schedules operation of the memory device 510a considering a refresh, operation of the memory cell rows in the first and second groups of the memory device 510a in the third RTR RTR3, and fee scheduler 550a schedules an operation of the memory device 510a considering a refresh operation of the memory cell rows in the first group of the memory device 510a in the fourth RTR RTR4.

Figure 12:
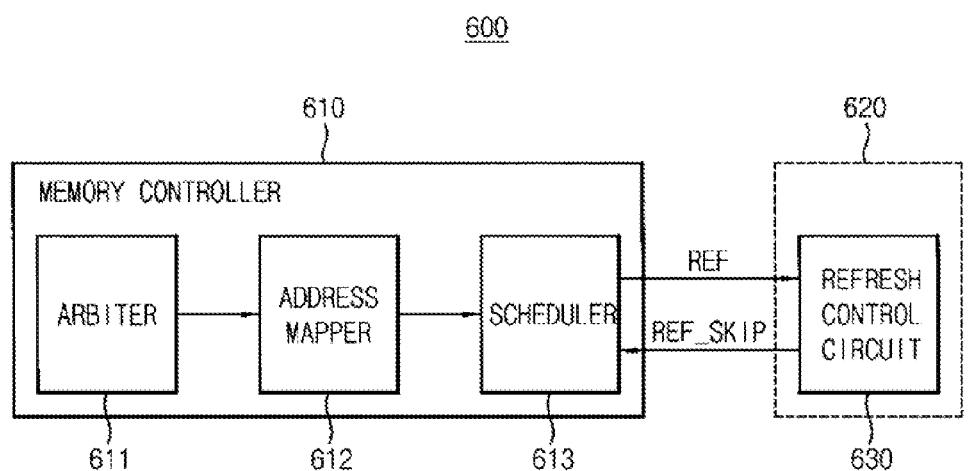
FIG. 12 is a block diagram illustrating a memory system according to an exemplary embodiment of the inventive concept.

FIG. 12 is a block diagram illustrating a memory system according to an exemplary embodiment of the inventive concept.

Referring to FIG. 12, a memory system 600 includes a memory device 620 and a memory controller 610 that controls the memory device 620. The memory controller 610 includes an arbiter 611, an address mapper 612, and a scheduler 613. The memory device 620 includes a refresh control circuit 630 and a memory cell array having a plurality of memory cell rows.

The arbiter 611 outputs virtual addresses in response to a request REQ from a host. The address mapper 612 maps the virtual addresses to logical addresses for accessing the memory device 510a. The scheduler 550a schedules the operation of the memory device 620 based on the logical addresses from the address mapper 612 and provides the memory device 620 wife a refresh command REF for refreshing fee memory cell rows of the memory device 620.

The refresh control circuit 630 may employ the refresh control circuit 430a as shown in FIG. 9, and the refresh control circuit 630 may provide respective refresh periods to respective groups grouped based on data retention times of the memory cell rows. The refresh control circuit 630 may provide the scheduler 613 with a refresh skip message REF_SKIP when the refresh operation is not performed on the memory cell rows in each of the RTRs.

The scheduler 613 may reschedule the operation of the memory device 620 based on fee refresh skip message REF_SKIP. For example, when the memory controller transmits the refresh command REF to the memory device 620, and the memory device 620 transmits fee refresh skip message REF_SKIP to the memory controller 610 because no refresh operation needs to be performed, the memory controller 620 transmits an act ACT command to the memory device 620 without waiting for completion of a refresh operation. The refresh skip message REF_SKIP may be transmitted to the memory controller 610 through an extra pin or DQ pin or DQS pin between the memory controller 610 and the memory device 620.

Figure 13:
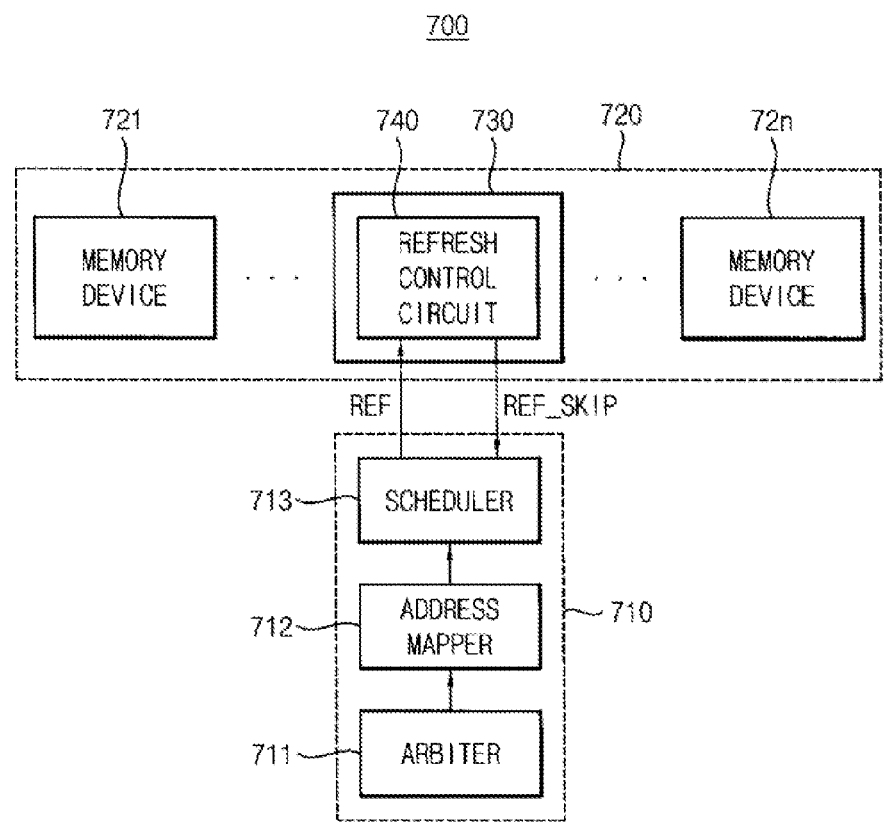
FIG. 13 is a block diagram illustrating a memory system according to an exemplary embodiment of the inventive concept.

FIG. 13 is a block diagram illustrating a memory system according to an exemplary embodiment of the inventive concept.

Referring to FIG. 13, a memory system 700 includes a memory controller 710 and a memory module 720. The memory module 720 includes a plurality of memory devices 721 to 72n and a buffer chip 730. The memory controller 710 provides various signals, e.g., a command CMD, an address ADD, and a clock signal CLK, for controlling die semiconductor device included in the memory module 720. The memory controller 710 can communicate with the memory module 720. For example, the memory controller 710 may provide data to the memory module 720 or receive data from the memory module 720.

The memory controller 710 includes an arbiter 711, an address mapper 712, and a scheduler 713. The buffer chip 730 includes a refresh control circuit 740. The arbiter 711 outputs virtual addresses in response to a request REQ from a host. The address mapper 712 maps the virtual addresses to logical addresses for accessing the memory devices 721 to 72n. The scheduler 713 schedules the operation of the memory devices 721 to 72n based on the logical addresses from the address mapper 712 and provides the buffer chip 730 with a refresh command REF for refreshing the memory cell rows of the memory devices 721 to 72n.

The buffer chip 730 may employ the buffer chip 300a as shown in FIG. 7. The buffer chip 730 may include a refresh control circuit 740, a buffer logic unit, and first and second multiplexers, and the buffer chip 730 may control the operation of the memory devices 721 to 72n. The refresh control circuit 740 may employ the refresh control circuit 330a as shown in FIG. 7. The refresh control circuit 740 may provide respective refresh periods to respective groups grouped based on data retention times of the memory cell rows. The refresh control circuit 740 may provide the scheduler 713 with a refresh skip message REF_SKIP when the refresh operation is not performed on the memory cell rows in each of the RTRs.

The scheduler 713 may reschedule the operation of the memory devices 721 to 72n based on the refresh skip message REF_SKIP. For example, when the memory controller transmits the refresh command REF to the refresh control circuit 740 and the refresh control circuit 740 transmits the refresh skip message REF SKIP to the memory controller 710 because no refresh operation needs to be performed in the memory devices 721 to 72n, the memory controller 710 transmits an act ACT command to the buffer chip 730 without waiting for completion of a refresh operation in the memory devices 721 to 72n. The buffer chip 730 transmits the act command ACT to the memory devices 721 to 72n, and the memory devices 721 to 72n perform normal operations.

Figure 14:
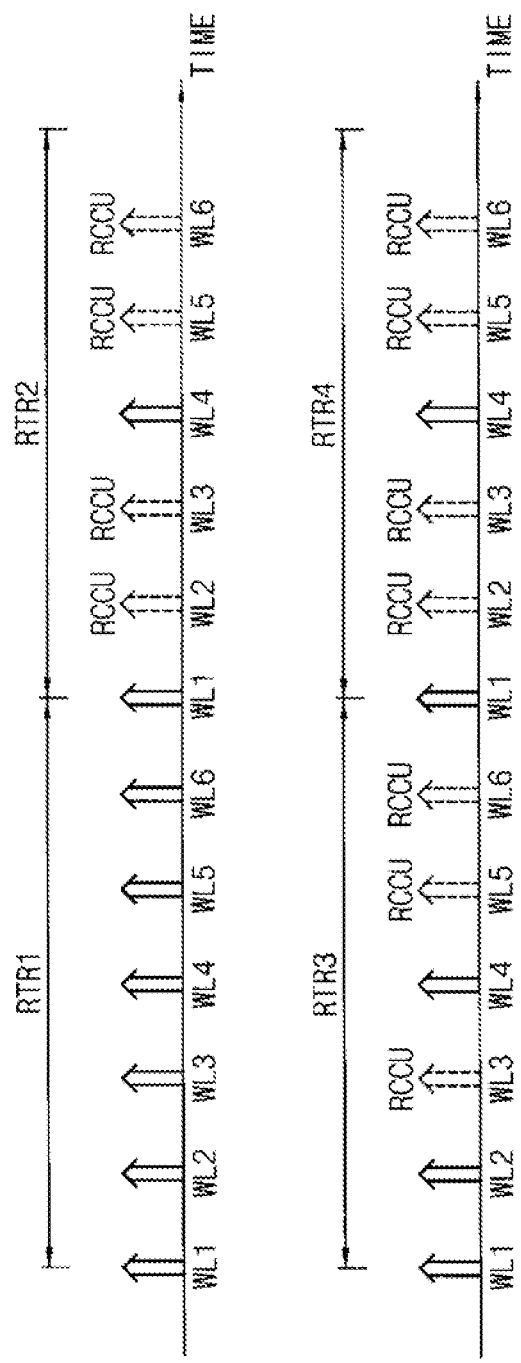
FIG. 14 illustrates a refresh operation according to an exemplary embodiment of the inventive concept.

FIG. 14 illustrates a refresh operation according to an exemplary embodiment of the inventive concept.

The refresh operation as shown in FIG. 14 differs from the refresh operation as shown in FIG. 2 in that a refresh counter in a memory device performs a counting-up operation without outputting refresh row addresses in response to a refresh counter counting-up RCCU command instead of skipping the refresh operation. Therefore, a refresh operation is not performed on corresponding memory cell rows.

A plurality- of memory cell rows constituting a memory cell array are grouped into a plurality of groups based on data retention times of the memory cell rows. For example, when the memory cell array includes a plurality of memory cell rows WL1 to WL6, f the memory cell rows WL1 and WL4 having a data retention time of 64 to 128 ms are grouped into a first group, the memory cell row WL2 having a data retention time of 128 to 256 ms is grouped into a second group, and the memory cell rows WL3, WL5 and WL4 having a data retention time greater than 256 ms are grouped into a third group.

When the memory cell rows WL1 to WL6 are grouped into the first through third groups based on the data retention time, a plurality of refresh time regions (RTRs) may be set based on the number of the groups. For example, the number of the groups is 3, the RTRs may be set to first through fourth RTRs, and the first through fourth RTRs may be periodically repeated. The memory cell rows to be refreshed are written in a bloom filter table in at least some of the RTRs. Refresh row addresses of the memory cell rows in each of the RTRs are hashed. A memory cell row is refreshed when a hashing index matches a bloom filter table corresponding to each of the RTRs, and a counting-up operation of the refresh counter is performed when the hashing index does not match the bloom table corresponding to each of the RTRs. For example, each group is individually refreshed at its respective refresh period.

A refresh row address is not to be transmitted to the memory device using an RCCU command RCCU instead of the skip command SKIP when the refresh operation is not to be performed on the memory cell rows, and thus power consumption may be reduced.

Figure 15:
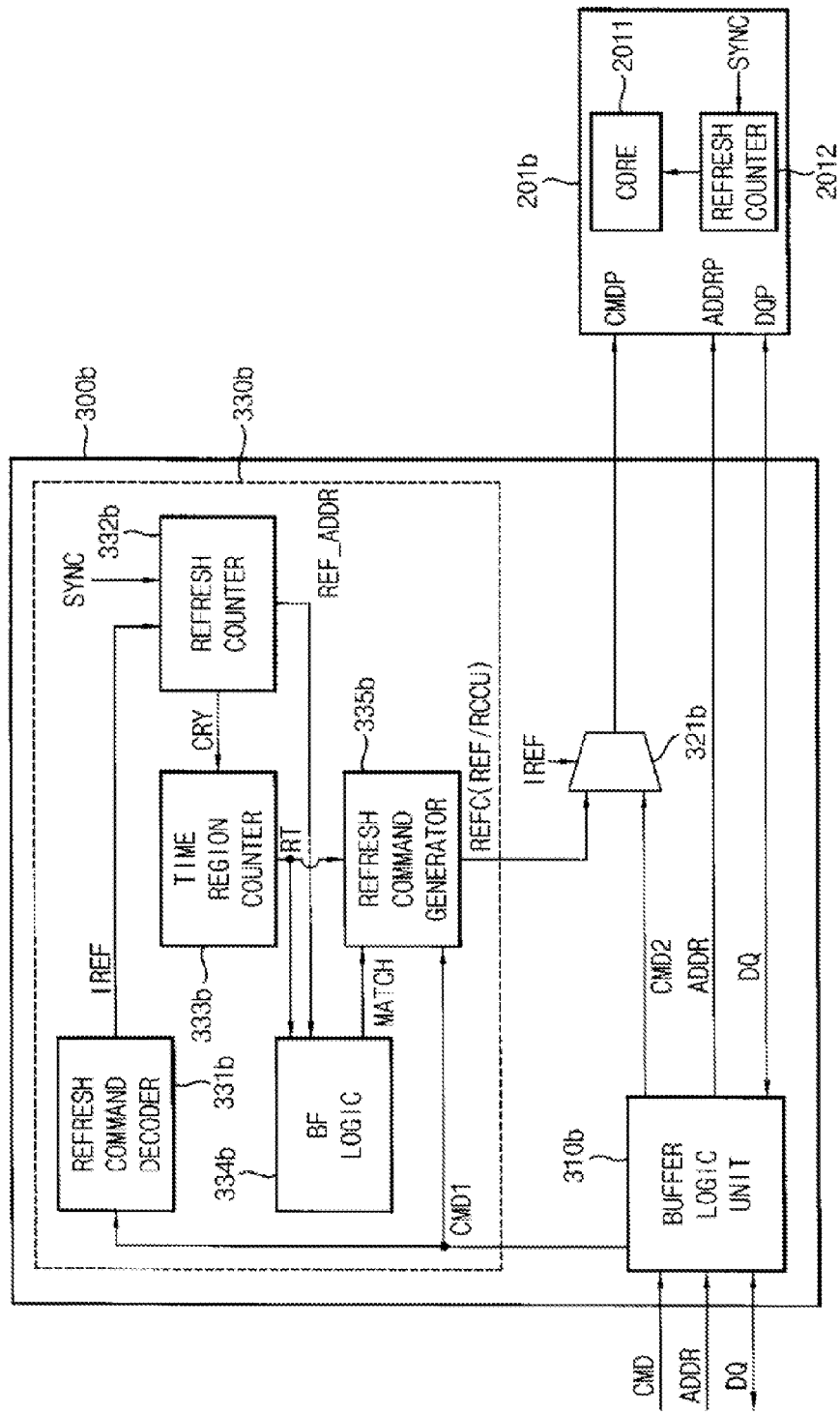
FIG. 15 illustrates connection relationship between a buffer chip and one of the memory devices in FIG. 5 according to an exemplary embodiment of the inventive concept.

FIG. 15 illustrates a connection relationship between a buffer chip and one of the memory devices as shown in FIG. 5 according to an exemplary embodiment of the inventive concept.

Referring to FIG. 15, a buffer chip 300b includes a buffer logic unit 310b, a multiplexer 321b and a refresh control circuit 330b, and the memory device 201b includes a memory core 2011 and a refresh counter 2012.

The buffer logic unit 310b provides a command CMD from the memory controller 110 to the refresh control circuit 330b as a first command CMD1, or the buffer logic unit 310b provides the command CMD to the multiplexer 321b as a second command CMD2 based on whether the command CMD is associated with a refresh operation. When the command CMD is associated with the refresh operation, the buffer logic 310b provides the command CMD to the refresh control circuit 330b as the first command CMD1. When the command CMD is not associated with the refresh operation but is associated with an act/write/read/preacharge/power-down operation, the buffer logic 310b provides the command CMD to the multiplexer 321b as the second command CMD2. The buffer logic unit 310b buffers an address ADDR to be provided to an address pin ADDRP of the memory device 201b.

The refresh control circuit 330b may include a refresh command decoder 331b, a refresh counter 332b, a time region counter 333b, a bloom filter logic 334b, and a refresh command generator 335b.

The refresh command decoder 331b decodes the first command CMD1 and generates an internal refresh command IREF. The refresh counter 332b generates a refresh row address REF_ADDR that gradually increments or decrements in response to the internal refresh command IREF. The refresh counter 332b generates a carry bit CRT whenever the refresh row address REF_ADDR has its maximum/minimum value. The time region counter 333b provides a RTR signal RT indicating one of a plurality of RTRS that are periodically repeated in response to the carry bit CRY. The bloom filter logic 334b includes a hashing logic and a bloom filter table unit including a plurality of bloom filter tables. Each of the bloom filter tables stores hashing indexes representing page addresses of the memory cell rows to be refreshed in each of RTRs.

The bloom filter table unit provides the refresh command generator 335b with a match signal MATCH indicating whether the refresh row address REF_ADDR matches the bloom filter tables. The refresh command generator 335b may generate a refresh command REFC that determines whether the memory cell row corresponding to the refresh row address REF_ADDR is to be refreshed based on the match signal MATCH and the RTR signal RT.

For example, when the refresh row address REF_ADDR matches the bloom filter table unit, the refresh command generator 335b may generate a refresh enable command REF that refreshes a corresponding memory cell row. When the refresh row address REF_ADDR does not match the bloom filter table unit, the refresh command generator 335b may generate a RCCU command RCCU that counts up a refresh counter 2012 without generating a refresh row address for the corresponding memory cell row.

The multiplexer 321b selects one of the refresh command REFC and the second command CMD2 and provides the selected command to a command pin CMDP of the memory device 201b in response to the internal refresh command IREF. For example, when the internal refresh command IREF is at a high level because the command CMD is associated with the refresh operation, the multiplexer 321b selects the refresh command REFC. When the internal refresh command IREF is at a low level because the command CMD is associated with a normal operation, the multiplexer 321b selects the second command CMD2.

The refresh counter 332b and the refresh counter 2012 operate in synchronization with each other in response to a synchronous signal SYNC. For example, the refresh counter 332b and the refresh counter 2012 may generate the same refresh row address REF_ADDR. The synchronization of the refresh counter 332b and the refresh counter 2012 may be substantially simultaneously initialized during a power-up sequence of the memory system. Counting values of the refresh counter 2012 may be transmitted to the refresh counter 332b. The refresh counter 2012 performs a counting-up operation while outputting a refresh row address REF_ADDR in response to a refresh enable command REF from the buffer chip 300b. The refresh counter 2012 performs a counting-up operation without outputting a refresh row address REF_ADDR in response to a RCCU command RCCU from the buffer chip 300b.

The bloom filter logic 334b may employ the bloom filter logic 334a as shown in FIG. 8.

Figure 16:
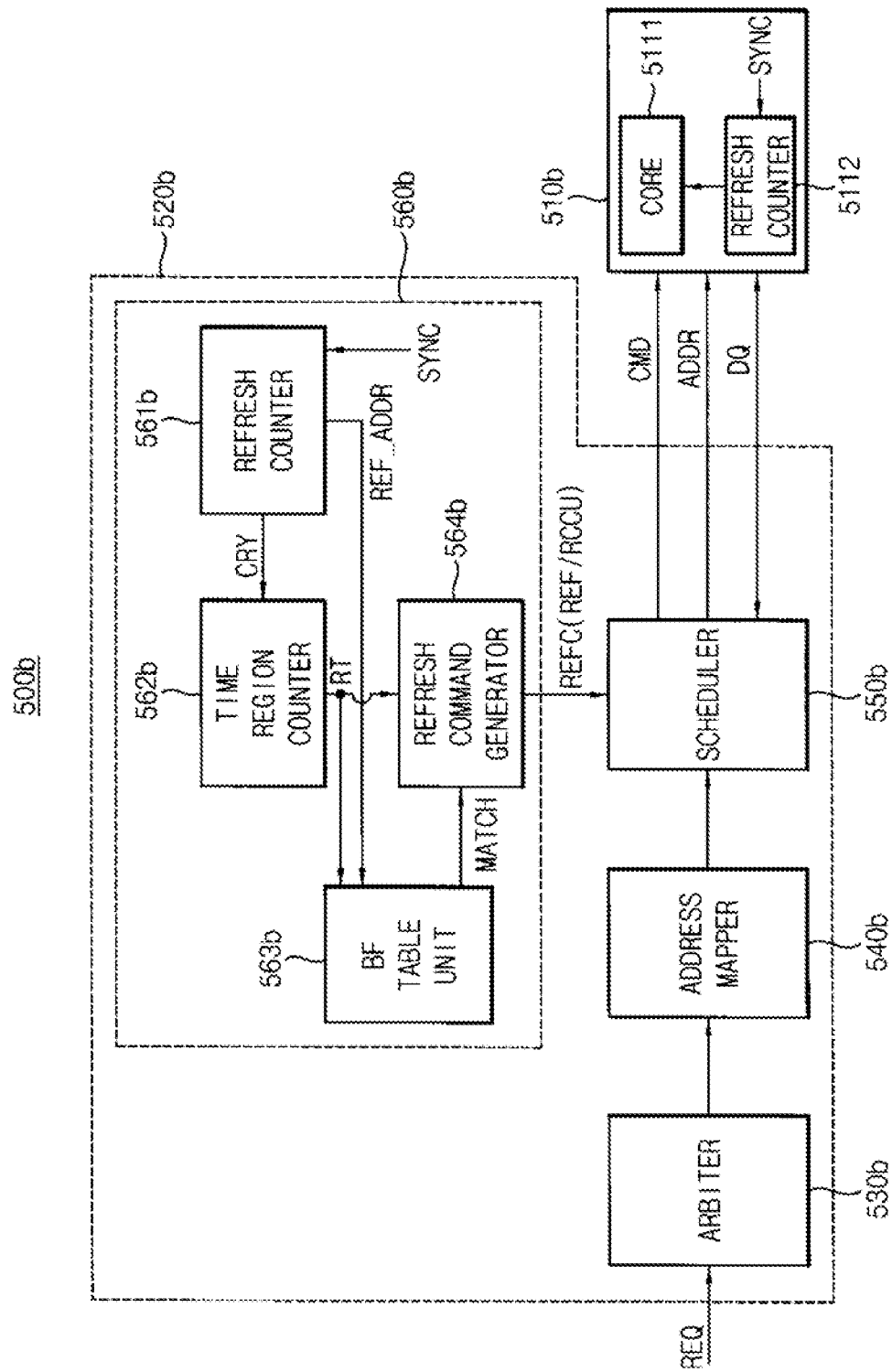
FIG. 16 is a block diagram illustrating a memory system according to an exemplary embodiment of the inventive concept.

FIG. 16 is a block diagram illustrating a memory system according to an exemplary embodiment of the inventive concept.

Referring to FIG. 16, a memory system 500b includes a memory device 510b and a memory controller 520b that controls the memory device 510b. The memory controller 520b includes an arbiter 530b, an address mapper 540b, a scheduler 550b, and a refresh control circuit 560b. The memory device 510b includes a memory core 5111 and a refresh counter 5112.

The arbiter 530b outputs virtual addresses in response to a request REQ from a host. The address mapper 540b maps the virtual addresses to logical addresses for accessing the memory device 510b. The scheduler 550b schedules the logical address ADDR and command CMD and provides the scheduled address ADDR and command CMD to the memory device 510b based on a refresh command REFC and a refresh row address REF_ADDR from the refresh control circuit 560b. The scheduler 550b exchanges data DQ with the memory device 510b.

The refresh control circuit 560b may include a refresh counter 561b, a time region counter 562b, a bloom filter logic 563b, and a refresh command generator 564b. The refresh counter 561b generates a refresh row address REF_ADDR that gradually increments or decrements at refresh timing of the memory device 510b. The refresh counter 561b generates a carry bit CRT whenever the refresh row address REF_ADDR has its maximum/minimum value. The time region counter 562b provides a RTR signal RT indicating one of a plurality of RTRs that are periodically repeated in response to the carry bit CRY.

The bloom filter logic 563b includes a hashing logic and a bloom filter table unit including a plurality of bloom filter tables as shown in FIG. 8. Each of the bloom filter tables stores hashing indexes representing page addresses of the memory cell rows to be refreshed in each of RTRs. The bloom filter table unit provides the refresh command generator 564b with a match signal MATCH indicating whether the refresh row address REF_ADDR matches the bloom filter tables. The refresh command generator 564b may generate a refresh command REFC feat determines whether fee memory cell row corresponding to the refresh row address REF_ADDR is to be refreshed based on the match signal MATCH and the RTR signal RT.

When the match signal MATCH is at a high level and the memory cell row is to be refreshed, the refresh command generator 564b generates the refresh enable command REF. The refresh counter 5112 generates the refresh row address for refreshing a corresponding memory cell row in response to the refresh enable command REF. The refresh counter 561b and the refresh counter 5112 operate in synchronization with each other in response to a synchronous signal SYNC. The refresh counter 561b and the refresh counter 5112 may generate the same refresh row address REF_ADDR. When the match signal MATCH is at a low level and fee memory cell row is not to be refreshed, the refresh command generator 564b generates the RCCU command RCCU. the refresh counter 5112 performs the counting-up operation without generating the refresh row address in response to the RCCU command RCCU.

Figure 17:
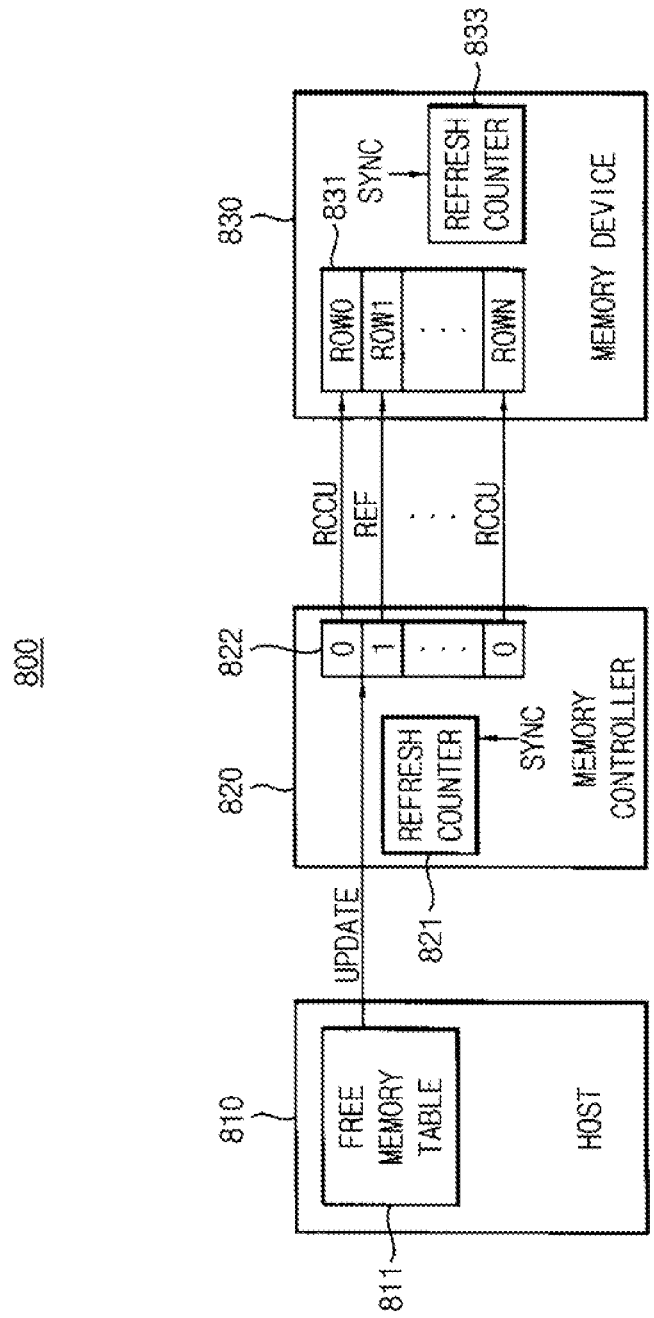
FIG. 17 is a block diagram illustrating a memory system according to an exemplary embodiment of the inventive concept.

FIG. 17 is a block diagram illustrating a memory system according to an exemplary embodiment of the inventive concept.

Referring to FIG. 17, a memory system 800 includes a host 810, a memory controller 820, and at least one memory device 830.

The host 810 may include a free memory table 811. The free memory table 811 may store unused memory areas of the at least one memory device 830. The memory controller 820 may include a refresh counter 821 and a bit-map 822. The memory device 830 may include a memory cell array 831 and a refresh counter 833. The memory cell array 831 may include a plurality of memory cell rows ROW0 to ROWN. The bit-map 822 stores '0' or '1' with respect to each of the memory cell rows ROW0 to ROWN based on whether each of the memory cell rows ROW0 to ROWN is used based on content stored in the free memory table 811. When the contents of the free memory table 810 are to be updated, the host 810 may update the bit-map 822. The refresh counter 821 and the refresh counter 833 operate in synchronization with each other in response to a synchronous signal SYNC. For example, the refresh counter 821 and the refresh counter 833 may generate the same refresh row address.

When the bit-map 822 stores '0' associated with the memory cell row ROW0, the memory controller 820 transmits the RCCU command RCCU to the memory device 830. The refresh counter 833 performs the counting-up operation without generating the refresh row address in response to the RCCU command RCCU.

When fee bit-map 822 stores '1' associated with fee memory cell row ROW1, the memory controller 820 transmits the refresh enable command REF to fee memory device 830. The refresh counter 833 performs fee counting-up operation while generating the refresh row address in response to the refresh enable command REF.

Figure 18:
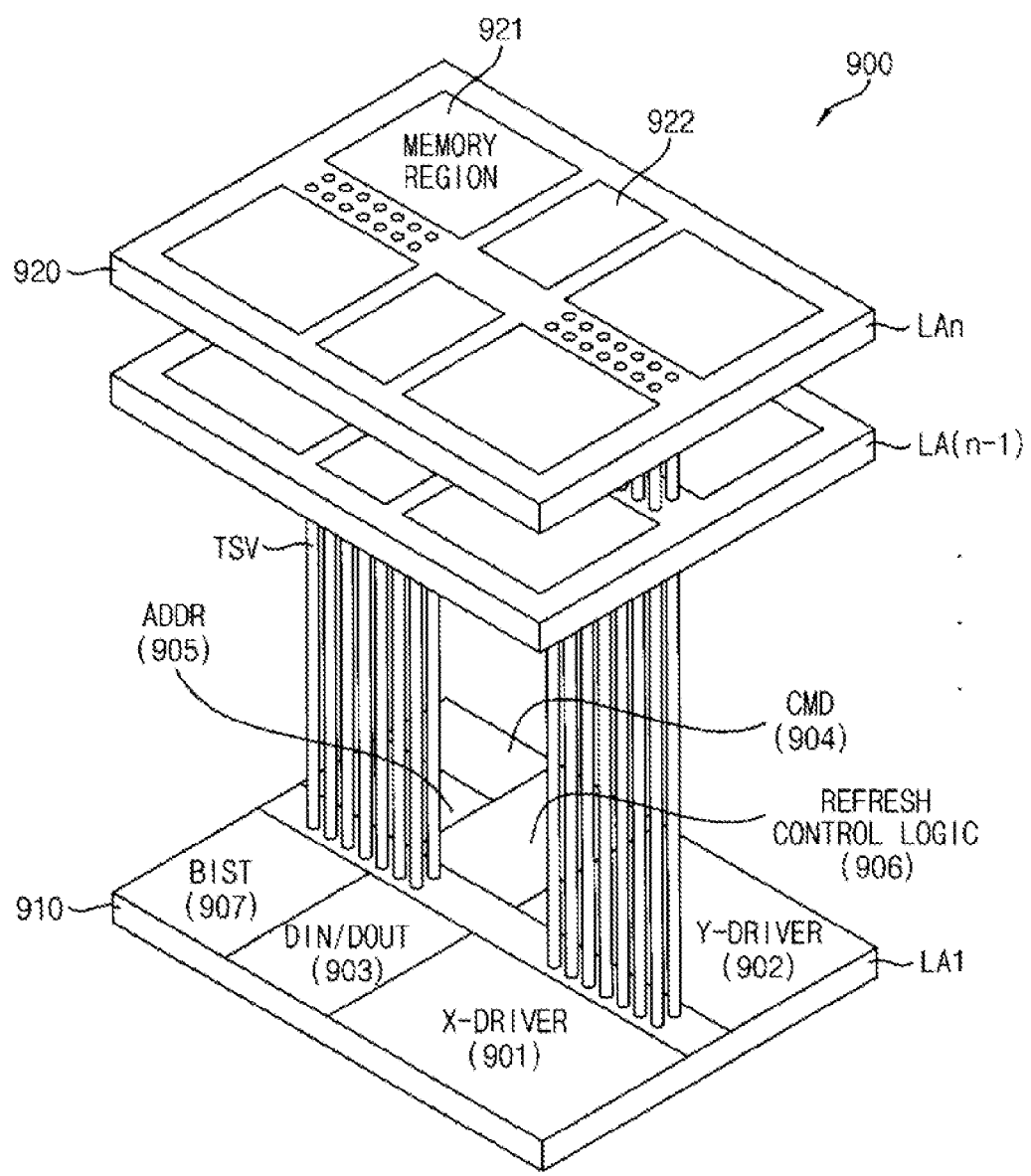
FIG. 18 is a structural diagram illustrating a device according to an exemplary embodiment of the inventive concept.

FIG. 18 is a diagram illustrating a device according to an exemplary embodiment of the inventive concept.

Referring to FIG. 18, a device 900 may include a plurality of first through nth semiconductor integrated circuit layers LA1 through LAn. For the purpose of description, the lowest first semiconductor integrated circuit layer LA1 is an interface or control chip, and the other semiconductor integrated circuit layers LA2 through LAn are slave chips including core memory chips. The plurality of semiconductor integrated circuit layers LA1 through LAn transmit and receive signals therebetween through through-silicon-vias (TSVs). The lowest first semiconductor integrated circuit layer LA1 as an interface or control chip communicates with an external memory controller through a conductive structure formed on an external surface thereof.

The first semiconductor integrated circuit layer 910 may include various peripheral circuits for driving memory regions 921 provided in the nth semiconductor integrated circuit layer 920. For example, the first semiconductor integrated circuit layer 910 may include a row (X)-driver 901 for driving word lines of a memory, a column (Y)-driver 902 for driving bit lines of the memory, a data input/output unit (Din/Dout) 903 for controlling input/output of data, a command buffer (CMD) 904 for receiving a command CMD from an outside device and buffering the command CMD, and an address buffer (ADDR) 905 for receiving an address from an outside device and buffering the address.

The first semiconductor integrated circuit layer 910 may further include a refresh control logic 906 for controlling refresh operations of the memory regions 921. The refresh control logic 906 may employ the refresh control circuit 330a as shown in FIG. 7. The first semiconductor integrated circuit layer 910 may further include a BIST unit 907 for testing a function of the semiconductor device 900 in a built-in form. A feature of the memory cell array is obtained according to the test result provided by the BIST unit 907, and the obtained feature is stored in a bloom filter table unit of the refresh control logic 906.

The nth semiconductor integrated circuit layer 920 may include the memory regions 621 including memory cell arrays and peripheral circuit regions 922. In the peripheral circuit regions 922, peripheral circuits for reading/writing data of the memory regions 921, e.g., a row decoder, a column decoder, and/or a bit line sense amplifier are arranged.

As shown in FIG. 18, data driving operations (read, write, and/or refresh operations) and management operations according to various techniques related to the data driving operations may be integrated in a single semiconductor device. The semiconductor device 900 may be a three-dimensional memory device including the plurality of semiconductor integrated circuit layers LA1 through LAn that include an interface or control chip and slave chips. The refresh control logic 906 or a buffer chip including the refresh control logic 906 is arranged in the first semiconductor integrated circuit layer 610 as the master chip.

Figure 19:
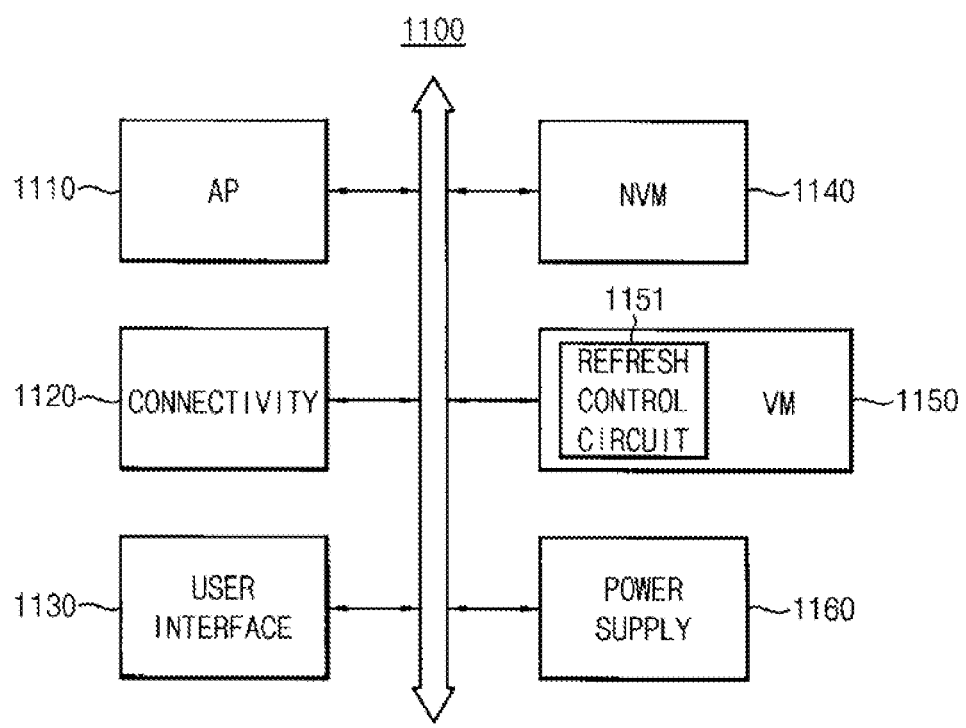
FIG. 19 is a block diagram illustrating a mobile system including a memory device according to an exemplary embodiment of the inventive concept.

FIG. 19 is a block diagram illustrating a mobile system including a memory device according to an exemplary embodiment of the inventive concept.

Referring to FIG. 19, a mobile system 1100 includes an application processor 1110, a connectivity unit 1120, a memory device 1150, a nonvolatile memory device 1140, a user interface 1130, and a power supply 1160. In an exemplary embodiment of the inventive concept the mobile system 1100 may be a mobile phone, a smart phone, a personal digital assistant (PDA), a portable multimedia player (PMP), a digital camera, a music player, a portable game console, and/or a navigation system.

The application processor 1110 may execute applications, such as a web browser, a game application, and/or a video player. In an exemplary embodiment of the inventive concept, the application processor 1110 may include a single core or multiple cores. For example, the application processor 1110 may be a multi-core processor, such as a dual-core processor, a quad-core processor, and/or a hexa-core processor. The application processor 1110 may include an internal and/or external cache memory.

The connectivity unit 1120 may perform wired or wireless communication with an external device. For example, the connectivity unit 1120 may perform Ethernet communication, near field communication (NFC), radio frequency identification (RFID) communication, mobile telecommunication, memory card communication, and/or universal serial bus (USB) communication. In an exemplary embodiment of the inventive concept, connectivity unit 1120 may include a baseband chipset that supports communications, such as global system for mobile communications (GSM), general packet radio service (GPRS), wideband code division multiple access (WCDMA), and/or high speed downlink/uplink packet access (HSxPA).

The memory device 1150 may store data processed by the application processor 1110, or the memory device 1150 may operate as a working memory. The memory device 1150 includes a refresh control circuit 1151. The refresh control circuit 1151 may employ the refresh control circuit 430a as shown in FIG. 9, and the refresh control circuit 1151 may apply respective refresh periods to groups grouped based on a data retention time. For example, the memory device 1150 may be a dynamic random access memory, such as DDR SDRAM, LFDDR SDRAM, GDDR SDRAM, and/or RDRAM, or the memory device 115 may be a volatile memory device that requires a refresh operation. Memory cell arrays in the memory device 1150 are grouped into groups based on the data retention time, and the groups may be individually refreshed in each of the RTRs.

The nonvolatile memory device 1140 may store a boot image for booting the mobile system 1100. For example, the nonvolatile memory device 1140 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), and/or a ferroelectric random access memory (FRAM).

The user interface 1130 may include at least one input device, such as a keypad, and/or a touch screen, and at least one output device, such as a speaker, and/or a display device. The power supply 1160 may supply a power supply voltage to the mobile system 1100. In an exemplary embodiment of the inventive concept, the mobile system 1100 may further include a camera image processor (CIS), and/or a storage device, such as a memory card, a solid state drive (SSD), a hard disk drive (HDD), and/or a CD-ROM.

In an exemplary embodiment of the inventive concept, the mobile system 1100 and/or components of the mobile system 1100 may be packaged in various forms, such as package on package (PoP), ball grid arrays (BGAs), chip scale packages (CSPs), plastic leaded chip earner (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and/or wafer-level processed stack package (WSP).

Figure 20:
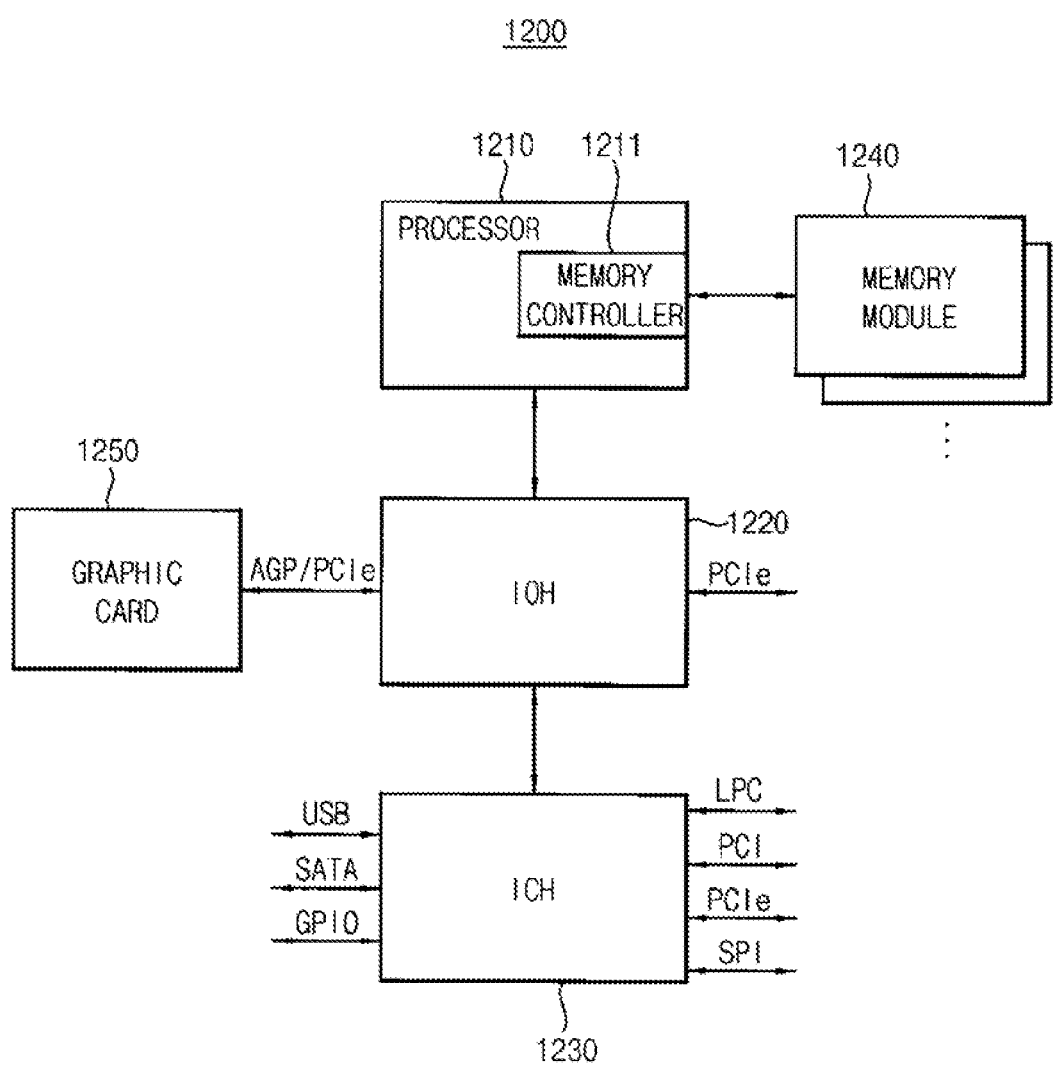
FIG. 20 is a block diagram illustrating a computing system according to an exemplary embodiment of the inventive concept.

FIG. 20 is a block diagram illustrating a computing system according to an exemplary embodiment of the inventive concept.

Referring to FIG. 20, a computing system 1200 includes a processor 1210, an input/output hub (IOH) 1220, an input/output controller hub (ICH) 1230, at least one memory module 1240, and a graphics card 1250. In an exemplary embodiment of the inventive concept, the computing system 1200 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, and/or a navigation system.

The processor 1210 may perform various computing functions, such as executing specific software for performing specific calculations or tasks. For example, the processor 1210 may be a microprocessor, a central processing unit (CPU), and/or a digital signal processor. In an exemplary embodiment of fee inventive concept, the processor 1210 may include a single core or multiple cores. For example, fee processor 1210 may be a multi-core processor, such as a dual-core processor, a quad-core processor, and/or a hexa-core processor. Although FIG. 20 illustrates the computing system 1200 including one processor 1210, in an exemplary embodiment of the inventive concept, the computing system 1200 may include a plurality of processors. The processor 1210 may include an internal or external cache memory.

The processor 1210 may include a memory controller 1211 for controlling operations of the memory module 1240. The memory controller 1211 included in the processor 1210 may be referred to as an integrated memory controller (IMC). A memory interface between the memory controller 1211 and the memory module 1240 may be implemented with a single channel including a plurality of signal lines, or fee memory interface may be implemented with multiple channels. At least one memory module 1240 may be coupled to each of the multiple channels. In an exemplary embodiment of the inventive concept., the memory controller 1211 may be located inside the input/output hub 1220, which may be referred to as memory controller hub (MCH).

The memory module 1240 may include a plurality of memory devices that store data provided from the memory controller 1211. Each memory device may be a dynamic random access memory, such as DDR SDRAM, LPDDR SDRAM, GDDR SDRAM, and/or RDRAM, or the memory- device may be a volatile memory device that requires a refresh operation. Each of the memory devices includes a refresh control circuit. The refresh control circuit may employ the refresh control circuit 430a as shown in FIG. 9, and the refresh control circuit may apply respective refresh periods to groups obtained based on a data retention time. Memory cell arrays in the memory devices are grouped into groups based on the data retention time, and the groups may be individually refreshed in each of the RTRs.

The input/output hub 1220 may manage data transfer between a processor 1210 and devices, such as the graphics card 1250. The input/output hub 1220 may be coupled to the processor 1210 via various interfaces. For example, the interlace between the processor 1210 and the input/output hub 1220 may be a front side bus (FSB), a system bus, a HyperTransport, a lightning data transport (LDT), a QuickPath interconnect (QPI), and/or a common system interface (CSI). Although FIG. 20 illustrates the computing system 1200 including one input/output hub 1220, in an exemplary embodiment of the inventive concept, the computing system 1200 may include a plurality of input/output hubs. The input/output hub 1220 may provide various interfaces with the devices. For example, the input/output hub 1220 may provide an accelerated graphics port (AGP) interface, a peripheral component interface-express (PCIe), and/or a communications streaming architecture (CSA) interface.

The graphics card 1250 may be coupled to the input/output hub 1220 via AGP or PCIe. The graphics card 1250 may control a display device for displaying an image. The graphics card 1250 may include an internal processor for processing image data and an internal memory device. In an exemplary embodiment of the inventive concept, the input/output huh 1220 may include an internal graphics device along with or instead of the graphics card 1250 outside the graphics card 1250. The graphics device included in the input/output hub 1220 may be referred to as integrated graphics. The input/output hub 1220 including the internal memory controller and the internal graphics device may be referred to as a graphics arid memory controller hub (GMCH).

The input/output controller hub 1230 may perform data buffering and interface arbitration to efficiently operate various system interfaces. The input/output controller hub 1230 may be coupled to the input/output hub 1220 via an internal bus, such as a direct media interface (DMI), a hub interface, an enterprise South bridge interface (ESI), and/or PCIe. The input/output controller hub 1230 may provide various interfaces with peripheral devices. For example, the input/output controller hub 1230 may provide a universal serial bus (USB) port, a serial advanced technology attachment (SATA) port, a general purpose input/output (GPIO), a low pin count (LPC) bus, a serial peripheral interface (SPI), PCI, and/or PCIe.

In an embodiment of the inventive concept, the processor 1210, the input/output hub 1220, and the input/output controller hub 1230 may be implemented in separate chipsets or separate integrated circuits. In an exemplary embodiment of the inventive concept, at least two of the processor 1210, the input/output hub 1220 and/or the input/output controller hub 1230 may be implemented in a single chipset.

As described above, memory cell rows are grouped into groups based on the data retention time, row addresses of the memory cell rows in each group are hashed, hashing indexes are written in the bloom filter table, and the groups may be individually refreshed in each of the RTRs. Therefore, refresh overhead and space for storing addresses for refresh operation may be reduced.

The inventive concept may be applied to various mobile applications according to exemplary embodiments thereof. Exemplary embodiments of the present inventive concept may be applied to systems such as be a mobile phone, a smart phone, a PDA, a PMP, a digital camera, a music player, a portable game console, and/or a navigation system.

While the present inventive concept has been particularly shown and described with reference to the exemplary embodiments thereof it will be understood by those of ordinary skill in the art that various changes in form and detail may be made thereto without departing from the spirit and scope of the inventive concept as defined by the following claims.

What is claimed is:

1. A memory module, comprising:
a memory device including a plurality of memory cell rows; and
a control circuit configured to group the plurality of memory cell rows into a plurality of groups according to a data retention time of each of the plurality of the memory cell rows, set a plurality of refresh time regions according to the number of the groups, the plurality of refresh time regions being periodically repeated, and refresh the plurality of groups during each of the plurality of refresh time regions, wherein when a filter table corresponds to a predetermined refresh time region of the plurality of refresh time regions, a first group whose address does not match an address stored in the filter table is not refreshed during the predetermined refresh time region,
wherein the refresh time regions include first through k-th refresh time regions based on the data retention time, and the control circuit is configured to generate a refresh enable signal that refreshes all of the memory cell rows in all of the groups when a refresh time region signal indicates the first refresh time region, wherein k is an integer equal to or greater than two.

2. The memory module of claim 1, wherein when the filter table does not correspond to the predetermined refresh time region, all of the groups are refreshed during the predetermined refresh time region.

3. The memory module of claim 1, wherein addresses of the groups correspond to hashing indexes, respectively.

4. The memory module of claim 1, wherein the control circuit is configured to output a skip command for the first group to the memory device during the predetermined refresh time region.

5. The memory module of claim 1, wherein the control circuit is configured to perform a counting-up operation for the first group without outputting the address of the first group during the predetermined refresh time region.

6. A memory module, comprising:
a plurality of memory devices;
a buffer chip configured to manage the memory devices, wherein the buffer chip comprises a refresh control circuit configured to group a plurality of memory cell rows of the memory devices into a plurality of groups according to data retention times of the memory cell rows, and selectively and periodically refresh each of the groups in each of a plurality of refresh time regions; and
a plurality of bloom filter tables stored in the memory module,
wherein each bloom filter table is associated with a different refresh time region of the plurality of refresh time regions, each bloom filter table stores address information identifying at least one of the groups, and each group is refreshed in a refresh time region associated with the bloom filter table that stores the address information identifying the each group,
wherein the refresh time regions include first through k-th refresh time regions based on the data retention times, and the refresh control circuit is configured to generate a refresh enable signal that refreshes all of the memory cell rows in all of the groups when a refresh time region signal indicates the first refresh time region, wherein k is an integer equal to or greater than two.

7. The memory module of claim 1, wherein the refresh control circuit comprises:
a refresh command decoder configured to provide an internal refresh command by decoding a command from an external device;
a refresh counter configured to generate a refresh row address by performing a counting operation in response to the internal refresh command, the refresh counter configured to increase a carry bit when the refresh counter generates a maximum address of the refresh row address; and
a time region counter configured to output the refresh time region signal that indicates one of the refresh time regions in response to the carry bit,
wherein row addresses of the memory cell rows of each group are hashed and written in the plurality of bloom filter tables in some of the refresh time regions, and a match signal indicating whether the refresh row address matches the bloom filter tables is generated in response to a hashing index, wherein the hashing index is generated by hashing the refresh row address,
wherein the refresh control circuit is configured to generate a refresh command that determines whether a memory cell row corresponding to the refresh row address is refreshed in response to the refresh time region signal and the match signal.

8. The memory module of claim 7, wherein the refresh control circuit is configured to generate the refresh enable signal that refreshes memory cell rows of a group associated with bloom filter tables selected by the refresh time region signal when the refresh time region signal indicates other refresh time regions except the first refresh time region of the first through k-th refresh time regions, and
the refresh control circuit is configured to generate a refresh skip command for memory cell rows of a group that is not associated with the selected bloom filter tables.

9. The memory module of claim 7, wherein each of the memory devices includes an internal refresh counter that is configured to operate in synchronization with the refresh counter,
the refresh control circuit is configured to generate the refresh enable signal that refreshes memory cell rows of a group associated with bloom filter tables selected by the refresh time region signal when the refresh time region signal indicates other refresh time regions except the first refresh time region of the first through k-th refresh time regions, and
the refresh control circuit is configured to generate a refresh counter counting-up command for memory cell rows of a group that is not associated with the selected bloom filter tables, the refresh counter counting-up command directing a counting-up operation of the internal refresh counter.

10. The memory module of claim 9, wherein the internal refresh counter is configured to perform the counting-up operation without outputting addresses for refreshing the memory cell rows in response to the refresh counter counting-up command.

11. The memory module of claim 7, wherein the bloom filter tables are selected in response to the refresh time region signal, and each of the selected bloom filter tables provides a match signal of its a corresponding memory cell row in response to the hashing index.

12. The memory module of claim 11, wherein the row addresses of the memory cell rows are written in the bloom filter tables before or after the memory module is packaged, and the bloom filter tables include nonvolatile memory devices.

13. The memory module of claim 11, wherein the row addresses of the memory cell rows are written in the bloom filter tables during a power-up sequence of the memory module, and the bloom filter tables include volatile memory devices.

14. A memory system, comprising:
at least one memory device; and
a memory controller configured to control the at least one memory device, wherein the memory controller comprises:
a refresh control circuit configured to group a plurality of memory cell rows of the at least one memory device into a plurality of groups according to a data retention time of the memory cell rows, and provide a refresh command for selectively and periodically refreshing each group in each of a plurality of refresh time regions; and
a plurality of bloom filter tables stored in the memory system,
wherein each bloom filter table is associated with a different refresh time region of the plurality of refresh time regions, each bloom filter table stores address information identifying at least one of the groups, and each group is refreshed in a refresh time region associated with the bloom filter table that stores the address information identifying the each group,
wherein an operation of the at least one memory device is scheduled in response to the refresh command,
wherein the refresh time regions include first through k-th refresh time regions based on the data retention time, and the refresh control circuit is configured to generate a refresh enable signal that refreshes all of the memory cell rows in all of the groups when a refresh time region signal indicates the first refresh time region, wherein k is an integer equal to or greater than two.

15. The memory system of claim 14, wherein the refresh control circuit comprises:
a refresh counter configured to perform a counting operation to generate a refresh row address, the refresh counter configured to increase a carry bit when the refresh counter generates a maximum address of the refresh row address; and
a time region counter configured to output the refresh time region signal that indicates one of the refresh time regions in response to the carry bit,
wherein row addresses of the memory cell rows of each group are hashed and written in the plurality of bloom filter tables in some of the refresh time regions, and a match signal indicating whether the refresh row address matches the bloom filter tables is generated in response to a hashing index, wherein the hashing index is generated by hashing the refresh row address.

16. The memory system of claim 15, wherein the refresh control circuit is configured to generate the refresh enable signal that refreshes memory cell rows of a group associated with bloom filter tables selected by the refresh time region signal when the refresh time region signal indicates other refresh time regions except the first refresh time region of the first through k-th refresh time regions, and
the refresh control circuit is configured to generate a refresh skip command for memory cell rows of a group that is not associated with the selected bloom filter tables.

17. The memory system of claim 15, wherein the at least one memory device includes an internal refresh counter that is configured to operate in synchronization with the refresh counter,
the refresh control circuit is configured to generate the refresh enable signal that refreshes memory cell rows of a group associated with bloom filter tables selected by the refresh time region signal when the refresh time region signal indicates other refresh time regions except the first refresh time region of the first through k-th refresh time regions, and
the refresh control circuit is configured to generate a refresh counter counting-up command for memory cell rows of a group that is not associated with the selected bloom filter tables, the refresh counter counting-up command directing a counting-up operation of the internal refresh counter.

18. The memory system of claim 15, wherein the at least one memory device is configured to transmit a refresh skip message to the memory controller when the at least one memory device does not perform a refresh operation on a corresponding memory cell row in response to a refresh skip command, and the memory controller is configured to reschedule an operation of the at least one memory device in response to the refresh skip message.

* * * * *